(12) United States Patent
Hwang

(10) Patent No.: US 12,277,891 B2
(45) Date of Patent: Apr. 15, 2025

(54) DISPLAY APPARATUS AND DRIVING METHOD THEREOF

(71) Applicant: LG Display Co., Ltd., Seoul (KR)

(72) Inventor: Jaesik Hwang, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/395,068

(22) Filed: Dec. 22, 2023

(65) Prior Publication Data

US 2024/0221595 A1    Jul. 4, 2024

(30) Foreign Application Priority Data

Dec. 30, 2022  (KR) .................. 10-2022-0191295

(51) Int. Cl.
G09G 3/20       (2006.01)
G09G 3/3233   (2016.01)
H10K 59/131   (2023.01)

(52) U.S. Cl.
CPC ......... *G09G 3/2096* (2013.01); *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/046* (2013.01); *G09G 2330/021* (2013.01)

(58) Field of Classification Search
CPC ... G09G 2300/0819; G09G 2300/0861; G09G 2300/0426; G09G 2300/0842; G09G 2300/0852; G09G 2310/0216; G09G 2310/0251; G09G 2310/0267; G09G 2310/08; G09G 2320/046; G09G 2330/021; G09G 2330/028; G09G 3/20; G09G 3/2096; G09G 3/32; G09G 3/3233
See application file for complete search history.

(56) References Cited

U.S. PATENT DOCUMENTS

| | | | |
|---|---|---|---|
| 11,676,528 B2 | 6/2023 | Kim et al. | |
| 2014/0198085 A1* | 7/2014 | Park | G09G 3/3241 345/212 |
| 2017/0116925 A1* | 4/2017 | Lee | G09G 3/3275 |
| 2022/0208074 A1* | 6/2022 | Kim | G09G 3/3241 |
| 2023/0133301 A1* | 5/2023 | Chen | H01L 27/124 345/211 |
| 2023/0267872 A1 | 8/2023 | Kim et al. | |
| 2023/0267888 A1* | 8/2023 | Liu | G09G 3/3233 345/214 |

FOREIGN PATENT DOCUMENTS

KR   10-2022-0090924 A    6/2022

\* cited by examiner

*Primary Examiner* — Richard J Hong
(74) *Attorney, Agent, or Firm* — Fenwick & West LLP

(57) ABSTRACT

The present disclosure relates to a display apparatus and a diving method thereof that can prevent a dark spot caused by a leakage of a reset voltage to the anode electrode of a light emitting diode. In the display apparatus, a first (anode) electrode of a light emitting diode EL, one electrode (a source or drain electrode) of an emission transistor T4, and one electrode (a source or drain electrode) of a reset transistor T6 connect to one another, and a fourth gate electrode of the emission transistor T4 and a sixth gate electrode of the reset transistor T6 connect to an emission control signal line EML, solving the problem of a dark spot, ensuring improvement in the quality and reliability of a product, and enabling a narrow bezel.

20 Claims, 7 Drawing Sheets

DISPLAY APPARATUS AND DRIVING METHOD THEREOF

CROSS-REFERENCE TO RELATED APPLICATION

This application claims the benefit of Republic of Korea Patent Application No. 10-2022-0191295 filed on Dec. 30, 2022, which is hereby incorporated by reference in its entirety.

TECHNICAL FIELD

The present disclosure relates to a display apparatus and a driving method thereof.

BACKGROUND

Organic light emitting diodes (OLEDs) comprise an anode electrode, a cathode electrode, and an organic compound layer formed between the anode electrode and the cathode electrode. The organic compound layer is comprised of a hole transport layer (HTL), an emission layer (EML), and an electron transport layer (ETL).

As a driving voltage is provided to the anode electrode and the cathode electrode, a hole passed through the HTL, and an electron passed through the ETL move to the EML and form an exciton. As a result, visible light is generated in the EML.

An active matrix-type organic light emitting display apparatus comprises an organic light emitting diode OLED that emits light on its own, and is used in a variety of areas due to its advantages like a rapid response speed, a high luminous efficiency, a high luminance, and a wide angle of view.

In an organic light emitting display apparatus, pixels comprising an organic light emitting diode respectively are arranged in a matrix form, and the luminance of the pixels is adjusted based on the gradation of video data. Each of the pixels comprises an organic light emitting diode, a driving transistor that controls driving current flowing in the organic light emitting diode based on a voltage between gate and source, and at least one or more switch transistors that program a voltage between gate and source of the driving transistor. A pixel circuit comprising the organic light emitting diode, the driving transistor and at least one or more of the switch transistors operates based on a scan signal and an emission signal.

SUMMARY

Technical Problems

In an organic light emitting display apparatus, an N-type oxide thin film transistor having a sampling and initialization period is used to improve a holding function of a voltage between gate and source of the driving transistor. Accordingly, the remaining critical P-type transistors proceed with a T-aging process to prevent leakage current.

However, even after the T-aging process, it is difficult to form a bias, and there is a risk of burning or being burnt and the like, caused by high-voltage driving.

In the case where a bias is set to a low value to reduce the risk element, a reset voltage leaks to the anode electrode of the light emitting diode, and frequently causes a dark spot.

To solve the problem, the applicant invented a display apparatus that can suppress the leakage of a reset voltage to the anode electrode of the light emitting diode.

An object of the present disclosure is to provide a display apparatus and a driving method thereof in which a signal for controlling application of a reset voltage to a light emitting diode is applied by sharing a light emitting signal line without reset signal supply line, and a reset voltage is supplied through the light emitting signal line.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claim.

Technical Solutions

In a display apparatus of an embodiment, a first (anode) electrode of a light emitting diode EL, one electrode (a source or drain electrode) of an emission transistor T4, and one electrode (a source or drain electrode) of a reset transistor T6 connect to one another, and a fourth gate electrode of the emission transistor T4 and a sixth gate electrode of the reset transistor T6 connect to an emission control signal line EML.

In the display apparatus of an embodiment, a scan driver may provide a scan (gate) signal to a plurality of pixels, a data driver may provide a data voltage to the plurality of pixels, an emission driver may provide an emission signal to the plurality of pixels, each pixel may comprise a light emitting diode, a driving transistor, and first to seventh transistors, third, fourth and sixth gate electrodes of the third, fourth and sixth transistors may connect to an emission signal line, one electrode of the fourth and sixth transistors may connect to the anode electrode of the light emitting diode, the other electrode of the fourth transistor may connect to the driving transistor, and the other electrode of the sixth transistor may connect to a reset voltage line.

In the display apparatus according to the exemplary embodiment of the present disclosure, a buffer layer, a first insulation layer, a second insulation layer, a fourth semiconductor layer, a fourth gate electrode, first and second electrodes (source and drain electrodes) of the emission transistor T4, a sixth semiconductor layer, a sixth gate electrode, first and second electrodes (source and drain electrodes) of the reset transistor T6, a third insulation layer, a protective layer, a first intermediate layer, a connection electrode, a second intermediate layer, and an emission layer of the light emitting element EL, a first (anode) electrode and a second (cathode) electrode, a bank layer and an encapsulation layer are stacked upward from a substrate in the lower portion of the display apparatus. Additionally, the source and drain electrodes of the emission transistor T4, and the source and drain electrodes of the reset transistor T6 may connect to the connection electrode through a third contact hole, and the connection electrode may connect to the first (anode) electrode of the light emitting element EL through a fourth contact hole.

Further, a driving method of a display apparatus according to the exemplary embodiment of the present disclosure may be provided. The driving method of a display apparatus 10, in which the fourth gate electrode of the emission transistor T4, the sixth gate electrode of the reset transistor T6 and the emission signal EM line are connected, and the first (anode) electrode of the light emitting element EL, one electrode (a source or drain electrode) of the emission transistor T4, and one electrode (a source or drain electrode)

of the reset transistor T6 are connected, may comprise (a) providing a high-level emission control signal EM to the fourth gate electrode of the emission transistor T4 and the sixth gate electrode of the reset transistor T6 from the emission control signal line, (b) turning on the reset transistor T6 and turning off the emission transistor T4 based on the high-level emission control signal EM, (c) providing a reset voltage VAR to the anode electrode of the light emitting element EL from the reset voltage line through the reset transistor T6, and (d) resetting the anode electrode based on the reset voltage VAR.

Other particulars of the embodiments are provided in the detailed description and the drawings.

Solutions in the embodiments are not limited to the above ones, and other solutions that are not mentioned above can be clearly understood by one having ordinary skill in the art from the following description.

Advantageous Effects

In the display apparatus according to the exemplary embodiment of the present disclosure, an anode reset voltage does not leak to the anode electrode of the light emitting element, even in the case where a bias is set to a low value, thereby preventing the occurrence of a dark spot.

Accordingly, an additional reset signal line or a GIP block for resetting the anode electrode of the light emitting diode is not needed.

In an embodiment, the risk of burning or being burnt and the like, caused by high-voltage driving, may be prevented even in the case where T-aging proceeds to prevent leakage current of other critical P-type transistors.

In an embodiment, an additional reset signal line or a GIP block for resetting the anode electrode of the light emitting diode is not needed, and the emission control signal line is shared and controlled, thereby reducing power consumption of a panel.

In an embodiment, the gate on voltage VGL, VEL and the gate off voltage VGH, VEH that are set for resetting the light emitting diode may change, thereby reducing power consumption of a panel.

In an embodiment, an additional reset signal line or a GIP block for resetting the anode electrode of the light emitting diode is not needed, and the emission control signal line is shared, thereby reducing the number of processes and manufacturing costs.

In an embodiment, the reset operation of the light emitting diode is controlled without an additional component, thereby simplifying a manufacturing process, reducing manufacturing costs and improving the quality of a product.

In an embodiment, the problem of a dark spot is solved, thereby improving the quality of a product, ensuring the reliability of a product, and enabling a narrow bezel.

Effects according to the present disclosure are not limited to the above ones, and other effects that are not mentioned above can be clearly understood by one having ordinary skill in the art from the following description.

Specific effects are described along with the above-described effects in the section of detailed description.

BRIEF DESCRIPTION OF DRAWINGS

The accompanying drawings constitute a part of the specification, illustrate one or more embodiments in the disclosure, and together with the specification, explain the disclosure, wherein.

DETAILED DESCRIPTION

Figure 1:
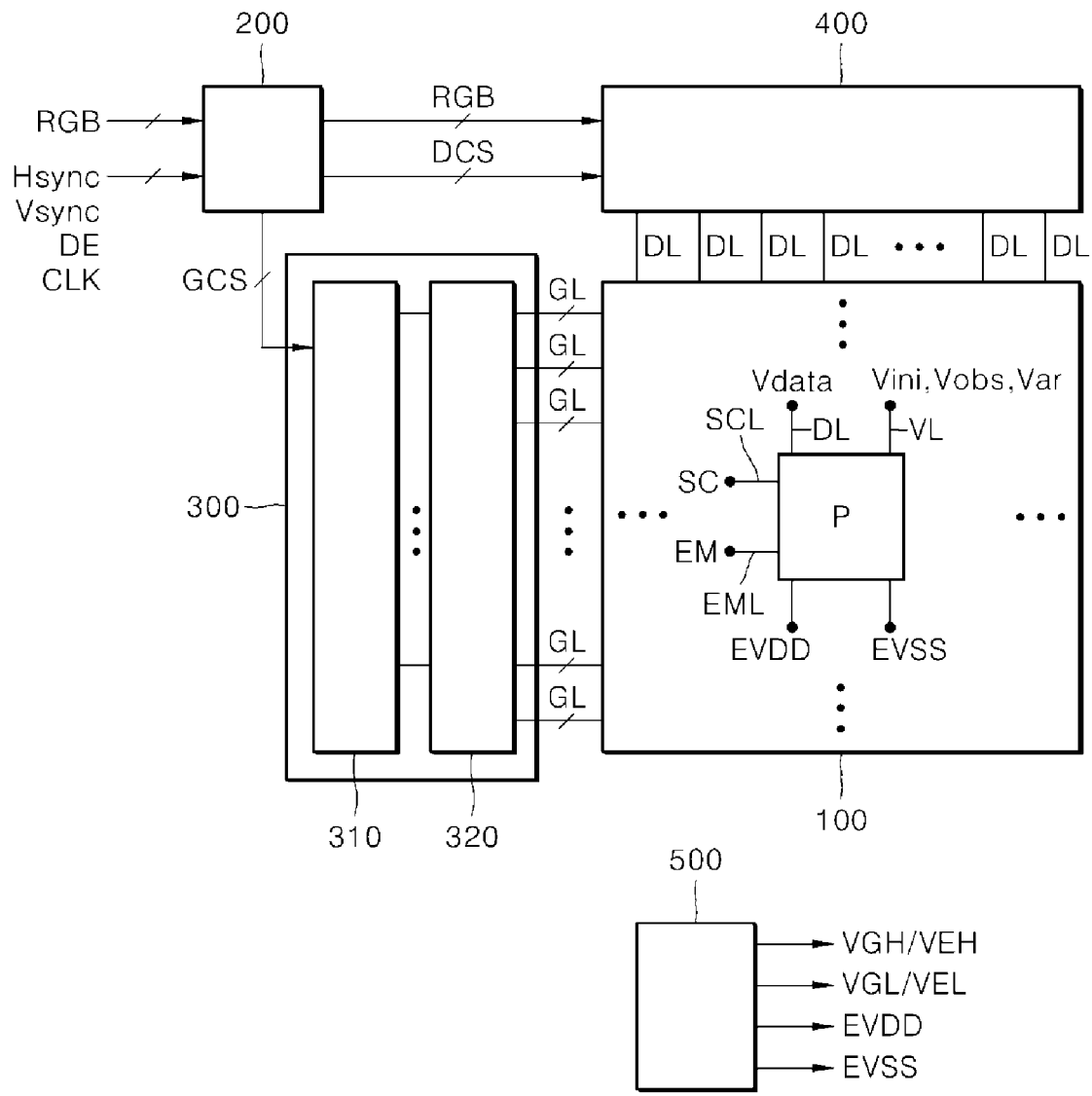
FIG. 1 is a block diagram schematically showing a display apparatus, according to an embodiment of the present disclosure.

In relation to embodiments set forth herein, a specific structure or function is provided as an example to describe the embodiments. However, embodiments are not limited to the embodiments set forth herein, and numerous other modifications and embodiments can be drawn.

In the present disclosure, specific embodiments are described in the detailed description and illustrated in the drawings. However, the embodiments set forth herein are not intended to limit embodiments of the present disclosure. Embodiments of the present disclosure is to comprise all the modifications, equivalents or replacements that are included in the technical spirit and scope of the disclosure.

The above-described aspects, features and advantages are specifically described hereafter with reference to the accompanying drawings such that one having ordinary skill in the art to which the disclosure pertains can embody the technical spirit of the disclosure easily.

In the disclosure, detailed description of known technologies in relation to the subject matter of the disclosure is omitted if it is deemed to make the gist of the disclosure unnecessarily vague.

Hereafter, preferred embodiments according to the disclosure are specifically described with reference to the accompanying drawings. In the drawings, identical reference numerals can denote identical or similar components.

When any one component is described as being "connected", "coupled", or "connected" to another component, any one component can be directly connected or coupled to another component, but an additional component can be "interposed" between the two components or the two components can be "connected", "coupled", or "connected" by an additional component. When any one component is described as being "directly connected", "directly coupled", or "directly connected" to another component, an additional component cannot be "interposed" between the two components. Additionally, other terms for describing a relationship between components, such as terms "between", "directly between", "adjacent to", "directly adjacent to" and the like are to be interpreted in the same way.

The terms used herein are to describe a specific embodiment, and are not intended to limit the subject matter of the disclosure. The singular forms "a", "an" and "the" are intended to include the plural forms as well, unless explicitly indicated otherwise. It is to be further understood that terms "comprise" or "include" and the like, set forth herein, are interpreted as indicating the presence of all the stated features, numbers, steps, operations, components, parts or a combination thereof, but are not interpreted as excluding one or more of additional features, numbers, steps, operations, components, parts or a combination thereof.

Unless otherwise defined, all the terms including technical and scientific terms used herein have the same meaning as commonly understood by one having ordinary skill in the art. Additionally, terms such as those defined in commonly used dictionaries are not to be interpreted in an ideal or overly way, unless explicitly defined herein.

In the case where any one embodiment is embodied differently, the function or operation in a specific block can be performed in a different order from the order in a flowchart. For example, continuous two blocks can be substantially performed at the same time or can be performed reversely depending on a relevant function or operation.

When spatial terms such as "on", "in an upper portion", "under", "in a lower portion", "adjacent to" and the like are used to describe a position relationship between two parts, one or more additional parts can be interposed between the two parts unless a term such as "right" or "directly" is used.

When temporal terms such as "after", "next", "following", "before" and the like are used to describe a temporal order, one or more additional events can be interposed between two events unless a term such as "right" or "directly" is used.

When any one element or layer is "on" or "over" another element or layer, any one element or layer can be directly on another element or layer, but an additional element or layer can be "interposed" between the two elements or layers. When any one element or layer is described as being "directly on" or "directly over" another element or layer, an additional element or layer cannot be "interposed" between the two elements or layers.

In the disclosure, spatial terms such as "below", "beneath", "lower", "above", "upper" and the like are used to describe a position relationship between on component or components and another component or other components. The spatial terms are to be interpreted as including directions of components when in use or in operation, in additions to their directions in the drawings. For example, a component in a drawing, described as being "below" or "beneath" another component, can be disposed "above" another component, when the component is overturned. Accordingly, the term "below" or "beneath" may imply both the upward direction and the downward direction.

Terms such as first, second and the like can be used to describe various components. These terms are only intended to distinguish one component from another component, and the components are not limited by such terms. Accordingly, a first component described hereafter can be a second component within the technical spirit of the disclosure.

Terms such as first, second, A, B, (a), (b) and the like are used herein only to distinguish one component from another component. Thus, the essence, order, sequence or number and the like of the components are not to be limited by the terms. When any one component is described as being "connected", "coupled", or "linked" to another component, any one component can be directly connected or coupled to another component, but unless stated explicitly, an additional component can be "interposed" between the two components that can be indirectly connected or coupled.

Advantages and features in the present disclosure and a method of ensuring the same can be clearly understood from the embodiments that are described hereafter with reference to the accompanying drawings. The subject matter of the disclosure, however, can be embodied in various different forms, and should not be construed as being limited to the embodiments set forth herein. Rather, the embodiments are provided as examples so that the disclosure can be thorough and complete and can fully convey the scope of the disclosure to one having ordinary skill in the art. The subject matter of the present disclosure is to be defined according to the scope of the claims.

The shapes, sizes, ratios, angles, number, and the like of the components illustrated in the drawings provided for describing the embodiments of the disclosure are given only as examples, and the subject matter of the disclosure is not limited by the particulars in the drawings. Throughout the disclosure, like reference numerals denote like components. In describing the subject matter, detailed description of well-known technologies relevant to the subject matter of the disclosure is omitted if it is deemed to make the gist of the disclosure unnecessarily vague. Throughout the disclosure, terms such as "comprise", "have", "comprised of" and the like are to imply the inclusion of any other component, but for a term such as "only". Further, the singular forms "a", "an" and "the" are intended to include the plural forms as well, unless explicitly stated otherwise.

In describing a component, the margin of error is to be included, though not explicitly described.

A term such as "at least one" is to be understood as comprising one or more combinations of relevant components. For example, "at least one of a first component, a second component, and a third component" may denote all combinations of two or more of the first component, the second component and the third component, as well as comprising the first component, the second component, or the third component.

In the present disclosure, the "apparatus" may comprise a display apparatus such as a liquid crystal module (LCM), and an organic light emitting display module (OLED Module) that comprise a display panel and a driver for driving the display panel. Additionally, the apparatus may comprise a set electronic apparatus or a set apparatus (or a set device) such as a mobile electronic apparatus and the like comprising a laptop, a television, a computer monitor, an apparatus for a vehicle or a passenger car (an automotive apparatus), a smart phone or an electronic pad and the like that are complete products or final products comprising an LCM, an OLED module and the like.

The apparatus according to the present disclosure may comprise a display apparatus itself such as an LCM, an OLED module and the like, and an application product or a set apparatus as a final consumer apparatus that comprises an LCM, an OLED module and the like.

In several embodiments, an LCM and an OLED module, which are comprised of a display panel, a driver and the like, may be expressed as a "display apparatus", and an electronic device as a final product comprising an LCM and an OLED module may be expressed as a "set apparatus". For example, the display apparatus may comprise a display panel of a liquid crystal display (LCD) or an organic light emitting diode (OLED), and a source PCB that is a controller for driving a display panel. The set apparatus may further comprise a set PCB that is a set controller connecting to a source PCB electrically and driving a set apparatus entirely.

The display panel in the embodiment may comprise all types of display panels including a liquid crystal display panel, an organic light emitting diode (OLED) display panel, an electroluminescent display panel and the like, but not be limited. For example, the display panel may be a display panel that can vibrate because of a vibration device in the embodiment and make a sound. The shape or size of the display panel that is applied to the display apparatus in the embodiment is not limited.

Features of the embodiments of the disclosure can be partially or entirely mixed or combined, and can technically link and operate in various ways. Further, each embodiment can be embodied independently, or in connection with each other.

Hereafter, the embodiments of the present disclosure are described as follows, with reference to the accompanying drawings and the embodiments. The scales of the components illustrated in the drawings are different from their actual scales for convenience of description, and their scales are not limited to the scales illustrated in the drawings.

Hereafter, a display apparatus and a driving method thereof in an embodiment are described with reference to the drawings.

FIG. 1 is a block diagram schematically showing a display apparatus, according to an embodiment of the present disclosure.

Referring to FIG. 1, an embodiment of a display apparatus 10 may comprise a display panel 100 comprising a plurality of pixels P, a controller 200, a gate driver 300 providing a gate signal to each of the plurality of pixels P, a data driver 400 providing a data signal to each of the plurality of pixels P, and a power supplier 500 supplying a power source required to drive each of the plurality of pixels P.

The display panel 100 comprises a display area (AA, see FIG. 2) in which a pixel P is disposed, and a non-display area (NA, see FIG. 2) which is disposed to surround the display area AA and in which the gate driver 300 and the data driver 400 are disposed.

In the display panel 100, a plurality of gate lines GL and a plurality of data lines DL cross each other, and each of the plurality of pixels P connects the gate line GL and the data line DL. Specifically, a single pixel P receives a gate signal from the gate driver 300 through the gate line GL, and a data signal from the data driver 400 through the data line DL, and receives a high-potential driving voltage EVDD and a low-potential driving voltage EVSS from the power supplier 500.

Herein, the gate line GL provides a scan signal SC and an emission control signal EM, and the data line DL provides a data voltage Vdata. Additionally, depending on embodiments, the gate line GL may comprise a plurality of scan lines SCL providing a scan signal SC, and an emission control signal line EML providing an emission control signal EM. Further, the plurality of pixels P may further comprise a power supply line VL and be supplied with a bias voltage Vobs and an initialization voltage Var, Vini.

Figure 2:
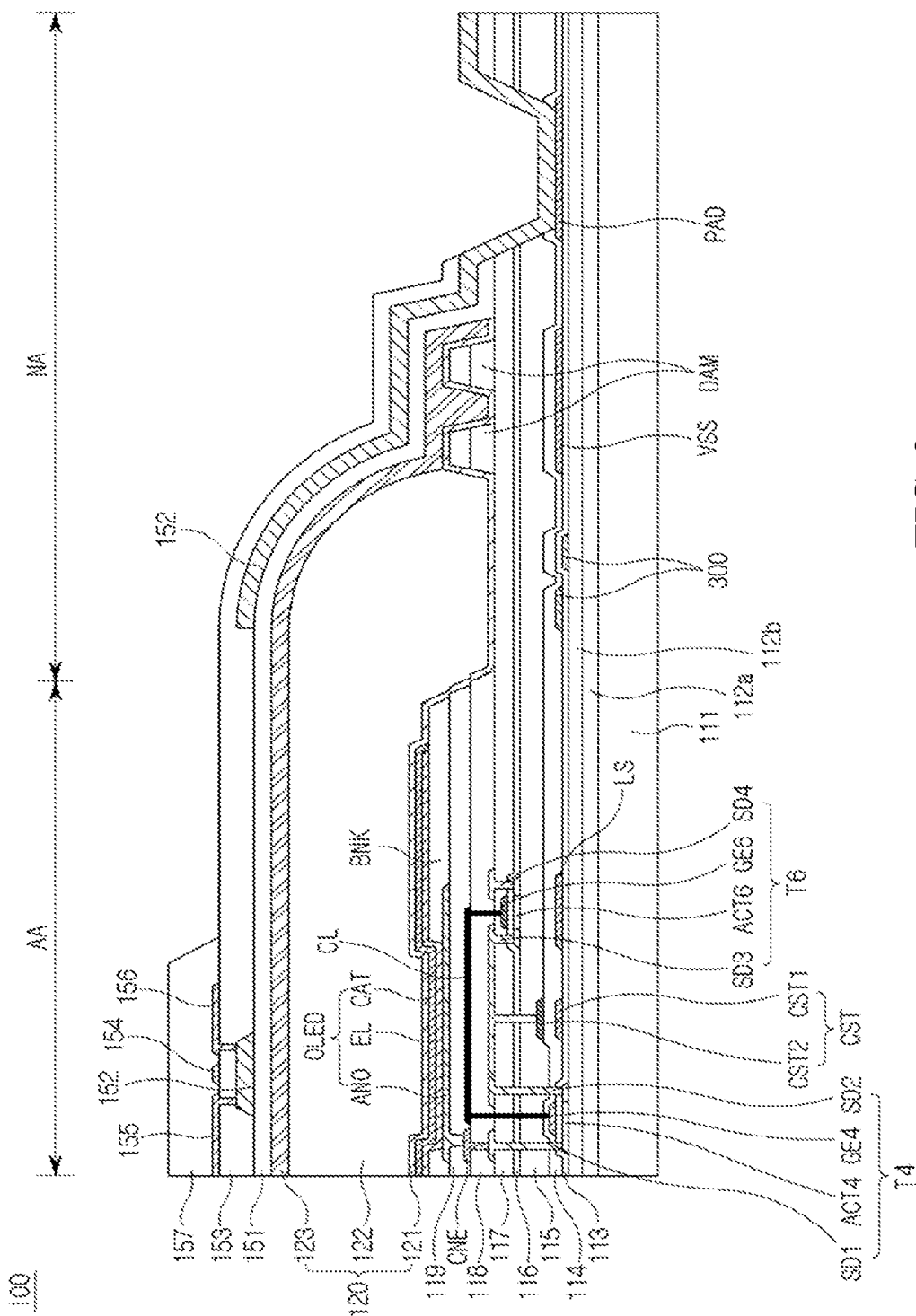
FIG. 2 is a cross-sectional view showing a stack shape of a display apparatus, according to an embodiment of the present disclosure.

Furthermore, each of the pixels P, as illustrated in FIG. 2, comprises a light emitting diode OLED and a pixel circuit controlling the driving of the light emitting diode EL. The light emitting diode OLED is comprised of an anode electrode ANO, a cathode electrode CAT, and an emission layer EL between the anode electrode ANO and the cathode electrode CAT.

The pixel circuit comprises a plurality of switching elements, a plurality of driving elements, and a plurality of capacitors. The switching elements and the driving elements may be comprised of a thin film transistor. In the pixel circuit, the driving element controls an amount of current that is supplied to the light emitting diode OLED, based on a data voltage, to adjust an amount of emitted light of the light emitting diode OLED. Additionally, the plurality of switching elements receive a scan signal SC that is provided through the plurality of scan lines SCL, and an emission control signal EM that is provided through the emission control signal line EML to operate the pixel circuit. The emission control signal EM can be simply referred to as an "emission signal EM".

The display panel 100 may be embodied as a non-transmittance display panel or a transmittance display panel. The transmittance display panel may be applied to a transparent display apparatus where an image is displayed on a screen and an object of background is seen. The display panel 100 may be manufactured as a flexible display panel. The flexible display panel may be embodied as an OLED panel that uses a plastic substrate.

Each of the pixel P may be divided into a red pixel, a green pixel and a blue pixel for color implementation. Each of the pixel P may further comprise a white pixel. Each of the pixel P comprises a pixel circuit.

Touch sensors may be disposed on the display panel 100. A touch input may be sensed by additional touch sensors or through pixels P. The touch sensors may be embodied as an on-cell type or add-on type touch sensor that is disposed on the screen of the display panel, or as an in-cell type touch sensor that is built into the display panel 100.

The controller 200 processes image data RGB input from the outside, such that the image data fit with the size and resolution of the display panel 100, and provides the same to the data driver 400. The controller 200 generates a gate control signal GCS and a data control signal DCS by using synchronization signals, which is input from the outside, e.g., a dot clock signal CLK, a data enable signal DE, a horizontal synchronization signal Hsync, and a vertical synchronization signal Vsync. The controller 200 provides the generated gate control signal GCS and the generated data control signal DCS respectively to the gate driver 300 and the data driver 400, to control the gate driver 300 and the data driver 400.

The controller 200 may be coupled to various types of processors, e.g., a microprocessor, a mobile processor, an application processor and the like, and may be embodied, depending on a device on which the controller 200 is mounted.

A host system may be any one of a television (TV) system, a set-top box, a navigation system, a personal computer (PC), a home theater system, a mobile device, a wearable device, and a vehicle system.

The controller 200 control the operation timing of a display panel driver using frequency-multiplying an input frame frequency by i times (the input frame frequency×I (i denotes positive integers greater than 0) Hz). The input frame frequency is 60 Hz in the National Television Standards Committee (NTSC) method, and is 50 Hz in the Phase-Alternating Line (PAL) method.

The controller 200 generates a signal to operate a pixel P in various refresh rates. That is, the controller 200 generates signals in association with the driving of a pixel p, such that the pixel P is driven in a variable refresh rate (VRR) mode or at a refresh rate that is changeable between a first refresh rate and a second refresh rate. For example, the controller 200 may drive a pixel P at various refresh rates simply by changing the speed of a clock signal, generating a synchronization signal to produce a horizontal blank or a vertical blank, or driving the gate driver 300 based on a mask method.

The controller 200 generates a gate control signal GCS for controlling the operation timing of the gate driver 300, and a data control signal DSC for controlling the operation timing of the data driver 400, based on a timing signal (Vsync, Hsync, DE) that is received from the host system. The controller 200 controls the operation timing of the display panel driver to synchronizes the gate driver 300 and the data driver 400.

The voltage level of a gate control signal GCS output from the controller 200 may be converted into a gate on voltage VGL, VEL and a gate off voltage VGH, VEH through a level shifter that is not illustrated, and provided to the gate driver 300. The level shifter converts a low-level voltage of the gate control signal GCS into a gate low voltage VGL and converts a high-level voltage of the gate control signal GCS into a gate high voltage VGH. The gate control signal GCS comprises a start pulse, and a shift clock.

The gate driver 300 provides a scan signal SC to the gate line GL, based on a gate control signal GCS that is provided from the controller 200. The gate driver 300 may be disposed at one side or both sides of the display panel 100, based on a gate in panel (GIP) method.

The gate driver 300 consecutively outputs a gate signal to the plurality of gate lines GL under the control of the controller 200. The gate driver 300 shifts a gate signal by using a shift register, and consecutively provides the shifted gate signal to the gate lines GL.

The gate signal may comprise a scan signal and an emission control signal EM in an organic light emitting display apparatus. The scan signal SC comprises a scan pulse that swings between a gate on voltage VGL and a gate off voltage VGH. The emission control signal EM may comprise an emission control signal pulse that swings between a gate on voltage VEL and a gate off voltage VEH.

The scan pulse synchronizes with a data voltage Vdata and selects the pixels P of a line to which the data voltage is applied. The emission control signal EM defines emission time (or period) of pixels P.

The gate driver 300 may comprise an emission control signal driver 310 and at least one or more of scan drivers 320.

The emission control signal driver 310 outputs an emission control signal pulse in response to a start pulse and a shift clock from the controller 200, and based on the shift clock, shifts the emission control signal pulse consecutively. The emission control signal driver 310 can be simply referred to as an "emission driver 310".

At least one or more of the scan drivers 320 outputs a scan pulse in response to a start pulse and a shift clock from the controller 200, and shifts the scan pulse according to a shift clock timing.

The data driver 400 converts image data RGB, based on a data control signal DCS supplied from the controller 200 into a data voltage Vdata, and provides the converted data voltage Vdata to a pixel P through the data line DL.

In FIG. 1, one data driver 400 is disposed at one side of the display panel 100, but the number and position of the data drivers 400 are not limited.

That is, the data driver 400 is comprised of a plurality of integrated circuits (IC), and divided into a plurality of ones and disposed at one side of the display panel 100.

The power supplier 500 generates a direct current (DC) power source required to drive a pixel array and the display panel driver of the display panel 100 by using a DC-DC converter. The DC-DC converter may comprise a charge pump, a regulator, a buck converter, a boost converter and the like. The power supplier 500 receives a DC input voltage supplied from the host system that is not illustrated, to generate a DC voltage such as a gate on voltage VGL, VEL, a gate off voltage VGH, VEH, a high-potential driving voltage EVDD, a low-potential driving voltage EVSS and the like. The gate on voltage VGL, VEL and the gate off voltage VGH, VEH are provided to a level shifter that is not illustrated, and the gate driver 300. The high-potential driving voltage EVDD and the low-potential driving voltage EVSS are commonly provided to pixels P.

FIG. 2 is a cross-sectional view showing a stack shape of a display apparatus, according to an embodiment of the present disclosure.

Referring to FIG. 2, in a display apparatus 10 of an embodiment, an emission transistor T4 for driving a light emitting diode OLED in a display area AA may be disposed on a substrate 111 comprising the display area AA and a non-display area NA. The emission transistor T4 may comprise a fourth semiconductor layer ACT4, a fourth gate electrode GE4, a first electrode SD1, and a second electrode SD2.

Additionally, in a display apparatus 10 of an embodiment, a reset transistor T6 for resetting the anode electrode ANO of a light emitting diode OLED may be disposed in the display area AA on the substrate 111. The reset transistor T6 may comprise a sixth semiconductor layer ACT6, a sixth gate electrode GE6, a first electrode SD3 and a second electrode SD4.

For convenience of description, the emission transistor T4 and the reset transistor T6 are only illustrated among various types of thin film transistors that may be included in the display apparatus 10, but another thin film transistor such as a switching transistor and the like may also be included in the display apparatus 10. Additionally, in the present disclosure, the thin film transistor TFT may have a coplanar structure, but may have another structure such as a staggered structure and the like and not be limited.

The emission transistor T4 receives a high-potential driving voltage EVDD in response to an emission control signal EM that is supplied to the fourth gate electrode GE4 of the emission transistor T4, to control current that is supplied to a light emitting diode OLED and to adjust an amount of emitted light of the light emitting diode OLED, and provides constant current until a data signal of a following frame is provided by a voltage charging a storage capacitor (not illustrated) to keep the light emitting diode OLED emitting. A high-potential supply line and the data line may be formed side by side.

The reset transistor T6 receives a reset voltage signal Var in response to an emission control signal EM that is supplied to the sixth gate electrode GE6 of the reset transistor T6, to deliver the reset voltage signal Var to an anode electrode ANO, N5 that is the first electrode of the light emitting diode OLED and to reset the anode electrode ANO of the light emitting diode OLED.

One pixel P comprises a light emitting diode OLED and a pixel driving circuit that supplies driving current to the light emitting diode OLED. The pixel driving circuit is disposed on the substrate 111, and the light emitting diode OLED is disposed on the pixel driving circuit. Additionally, an encapsulation layer 120 is disposed on the light emitting diode OLED. The encapsulation layer 120 protects the light emitting diode OLED.

The pixel diving circuit may refer to one pixel P array comprising a driving thin film transistor, a switching thin film transistor, and a capacitor. Additionally, the light emitting diode OLED may refer to an array for emitting light, which comprises an anode electrode, a cathode electrode and an emission layer disposed between the anode electrode and cathode electrode.

In one embodiment, the driving thin film transistor, and at least one of the switching thin film transistors use an oxide semiconductor as an active layer. A thin film transistor using an oxide semiconductor material as an active layer is excellent in blocking leakage current, and incurs less manufacturing costs than a thin film transistor using a polycrystalline semiconductor material as an active layer. To reduce power consumption and manufacturing costs, the pixel driving circuit in one embodiment comprises the driving thin film transistor and at least one of the switching thin film transistors that use an oxide semiconductor material.

All the thin film transistors constituting the pixel driving circuit may be embodied by using an oxide semiconductor material, and part of the switching thin film transistors constituting the pixel driving circuit may only be embodied by using an oxide semiconductor material.

However, a thin film transistor using an oxide semiconductor material is hardly reliable, and a thin film transistor using a polycrystalline semiconductor material is excellent in operation speed and reliability. In one embodiment, a switching thin film transistor using an oxide semiconductor material and a switching thin film transistor using a polycrystalline semiconductor material are both included.

The substrate 111 may be embodied as a multi-layer where an organic layer and an inorganic layer are alternately stacked. For example, the substrate 111 may be embodied in a way that a layer of an organic material such as polyimide and a layer of an inorganic material such as silicon (SiO2) are alternately stacked.

A lower buffer layer 112a is formed on the substrate 111. The lower buffer layer 112a is to block moisture that may penetrate from the outside, and is embodied in a way that a silicon oxide ($SiO_2$) layer and the like are staked in a plurality of layers. A subsidiary buffer layer 112b may be further disposed on the lower buffer layer 112a, to protect an element from the permeation of moisture.

The emission transistor T4 is formed on the substrate 111. The emission transistor T4 may use a polycrystalline semiconductor as an active layer. The emission transistor T4 comprises a fourth active layer ACT4 comprising a channel through which an electron or a hole moves, a fourth gate electrode GE4, a first source electrode SD1, and a first drain electrode SD2.

The fourth active layer ACT4 comprises a first channel area, and a first source area and a first drain area that are respectively disposed at one side of the first channel area and at the other side of the first channel area, with the first channel area therebetween.

The first source area and the first drain area are areas where an impurity ion in group 5 or 3, e.g., phosphorus (P) or boron (B), is doped and conducted on an intrinsic polycrystalline semiconductor material at a predetermined concentration. The first channel area is to maintain an intrinsic state of the polycrystalline semiconductor material, and provides a path in which an electron or a hole moves.

Additionally, the emission transistor T4 comprises a fourth gate electrode GE4 overlaying the first channel area of the fourth active layer ACT4. A first gate insulation layer 113 is disposed between the fourth gate electrode GE4 and the fourth active layer ACT4. The first gate insulation layer 113 are stacked with a layer of an inorganic material such as silicon nitride ($SiN_x$) and a silicon oxide ($SiO_2$) layer in a single layer or in multiple layers.

In one embodiment, the emission transistor T4 has a top gate structure in which a fourth gate electrode GE4 is disposed on a fourth active layer ACT4. Accordingly, a first electrode CST1 included in a capacitor CST and a light shielding layer LS included in a reset transistor T6 may be made of the same material as the fourth gate electrode GE4. The fourth gate electrode GE4, the first electrode CST1 and the light shielding layer LS may be formed based on a single mask process, thereby reducing the number of mask processes.

The fourth gate electrode GE4 is comprised of a metallic material. For example, the fourth gate electrode GE4 may be a single layer or multiple layers that are made of any one of molybdenum (Mo), aluminum (Al), chromium (Cr), gold (Au), titanium (Ti), nickel (Ni), neodymium (Nd) and copper (Cu), or an alloy thereof, but not limited.

A first interlayer insulation layer 114 is disposed on the fourth gate electrode GE4. The first interlayer insulation layer 114 may be made of a silicon oxide ($SiO_2$), a silicon nitride ($SiN_x$) and the like.

A display panel 100 may further comprise an upper buffer layer 115, a second gate insulation layer 116 and a second interlayer insulation layer 117 that are disposed consecutively on the first interlayer insulation layer 114. The emission transistor T4 comprises a first source electrode SD1 and a first drain electrode SD2 that are formed on the second interlayer insulation layer 117 and respectively connect to the first source area and the first drain area.

The first source electrode SD1 and the first drain electrode SD2 may be a single layer or multiple layers that are made of any one of molybdenum (Mo), aluminum (Al), chromium (Cr), gold (Au), titanium (Ti), nickel (Ni), neodymium (Nd) and copper (Cu), or an alloy thereof, but not limited.

The first drain electrode SD2 of the emission transistor T4 may connect to the second source electrode SD3 of the reset transistor T6 and form a fifth node N5.

The upper buffer layer 115 spaces a sixth active layer ACT6 of the reset transistor T6 as an oxide thin film transistor made of an oxide semiconductor material from the fourth active layer ACT4 made of a polycrystalline semiconductor material, and provides a base for forming the sixth active layer ACT6.

The second gate insulation layer 116 covers the sixth active layer ACT6 of the reset transistor T6. The second gate insulation layer 116 is embodied as an inorganic layer since the second gate layer 116 is formed on the sixth active layer ACT6 made of an oxide semiconductor material. For example, the second gate insulation layer 116 may be a silicon oxide ($SiO_2$) layer, a silicon nitride ($SiN_x$) layer and the like.

A sixth gate electrode GE6 is made of a metallic material. For example, the sixth gate electrode GE6 may be a single layer or multiple layers that are made of any one of molybdenum (Mo), aluminum (Al), chromium (Cr), gold (Au), titanium (Ti), nickel (Ni), neodymium (Nd) and copper (Cu), or an alloy thereof, but not limited.

The sixth gate electrode GE6 of the reset transistor T6 may contact the fourth gate electrode GE4 of the emission transistor T4 through a contact line (CL). At this time, the contact line CL is disposed on a first planarization layer 118, and one side of the contact line CL contacts the fourth gate electrode GE4 through a contact hole, while the other side contacts the sixth gate electrode GE through a contact hole. Accordingly, the fourth gate electrode GE and the sixth gate electrode GE connect each other through the contact line CL and form an A node.

Further, the reset transistor T6 comprises a sixth active layer ACT6 that is formed on the upper buffer layer 115 and made of an oxide semiconductor material, and a sixth gate electrode GE6 that is disposed on the second gate insulation layer 116, and a second source electrode SD3 and a second drain electrode SD4 that are disposed on a second interlayer insulation layer 117.

The sixth active layer ACT6 comprises an intrinsic second channel area that is made of an oxide semiconductor material and not doped with impurities, and a second source area and a second drain area that are doped with impurities and conducted.

The reset transistor T6 further comprises a light shielding layer LS that is disposed under the upper buffer layer 115 and overlays the sixth active layer ACT6. The light shielding layer LS blocks light that is incident to the sixth active layer ACT6, to ensure the reliability of the reset transistor T6. The light shielding layer LS may be made of the same material as the fourth gate electrode GE4 and formed on the upper surface of the first gate insulation layer 113. The light shielding layer LS may be electrically connected to the sixth gate electrode GE6 to form a dual gate.

The second source electrode SD3 and the second drain electrode SD4, and the first source electrode SD1 and the first drain electrode SD2 may be made of the same material, on the second interlayer insulation layer 117, at the same time, thereby reducing the number of mask processes.

Further, a second electrode CST2 is disposed on the first interlayer insulation layer 114, to overlay the first electrode CST1, to embody a capacitor CST. The second electrode CST2, for example, may be a single layer or multiple layers that are made of any one of molybdenum (Mo), aluminum (Al), chromium (Cr), gold (Au), titanium (Ti), nickel (Ni), neodymium (Nd) and copper (Cu), or an alloy thereof.

The capacitor CST stores a data voltage that is supplied through the data line DL for s certain period of time, and then provides the data voltage to a light emitting diode OLED. The capacitor CST comprises two electrodes that correspond to each other, and a dielectric that is disposed between the two electrodes. The first interlayer insulation layer 114 is disposed between the first electrode CST1 and the second electrode CST2.

The first electrode CST1 or the second electrode CST2 of the capacitor CST may electrically connect to a second source electrode SD3 or a second drain electrode SD4 of an oxide thin film transistor TFT2, but not be limited. The connection relationship of the capacitor CST may vary depending on the pixel driving circuit.

A first planarization layer 118 and a second planarization layer 119 are consecutively disposed on the pixel driving circuit, to planarize the upper end of the pixel driving circuit. The first planarization layer 118 and the second planarization layer 119 may be a layer of an organic material such as polyimide or an acrylic resin.

Additionally, a light emitting diode OLED is formed on the second planarization layer 119.

The light emitting diode OLED comprises an anode electrode ANO, a cathode electrode CAT, and an emission layer EL disposed between the anode electrode ANO and the cathode electrode CAT. In the case where the light emitting diode OLED is embodied as a pixel driving circuit that commonly uses a low-potential voltage connecting to the cathode electrode CAT, the anode electrode ANO is disposed as an additional electrode of each sub pixel. In the case where the light emitting diode OLED is embodied as a pixel driving circuit that commonly uses a high-potential voltage, the cathode electrode CAT may be disposed as an additional electrode of each sub pixel.

The light emitting diode OLED electrically connects to a driving element through an intermediate electrode CNE that is disposed on the first planarization layer 118. Specifically, the anode electrode ANO of the light emitting diode OLED, and the first source electrode SD1 of a polycrystalline thin film transistor TFT1 constituting the pixel driving circuit connect to each other through the intermediate electrode CNE.

The anode electrode ANO connects to an intermediate electrode CNE that is exposed through a contact hole penetrating the second planarization layer 119. Further, the intermediate electrode CNE connects to the first source electrode SD1 that is exposed through a contact hole penetrating the first planarization layer 118.

The intermediate electrode CNE serves as a medium for connecting the first source electrode SD1 and the anode electrode ANO. The intermediate electrode CNE may be made of a conductive material such as copper (Cu), silver (Ag), molybdenum (Mo) and titanium (Ti).

The anode electrode ANO may have a multi-layered structure comprising a transparent conductive layer and an opaque conductive layer of high reflection efficiency. The transparent conductive layer may be made of a material of a relatively high work function value such as indium tin oxide (ITO) or indium zinc oxide (IZO), and the opaque conductive layer may be comprised of a single layer or multiple layers that comprise any one of aluminum (Al), silver (Ag), copper (Cu), lead (Pb), molybdenum (Mo), titanium (Ti), or an alloy thereof. For example, the anode electrode ANO may have a structure in which a transparent conductive layer, an opaque conductive layer and a transparent conductive layer are stacked consecutively, or a structure in which a transparent conductive layer and an opaque conductive layer are stacked consecutively.

The emission layer EL is formed in a way that a hole-related layer, an organic emission layer, and an electron-related layer are stacked on the anode electrode ANO consecutively or reversely.

A bank layer BNK may be a pixel definition layer that exposes the anode electrode ANO of each pixel P. The bank layer BNK may be made of an opaque (e.g., black) material to prevent light interference between adjacent pixels P. At this time, the bank layer BNK comprises a light shielding material that is comprised of at least any one of color pigment, organic black and carbon. A spacer (not illustrated) may be further disposed on the bank layer BNK.

The cathode electrode CAT is formed on the upper surface and the lateral surface of the emission layer EL while facing the anode electrode ANO, with the emission layer EL between the cathode electrode CAT and the anode electrode ANO. The cathode electrode CAT may be integrally formed in the entire display area DA. In the case where the cathode electrode CAT is applied to a top emission organic light emitting display apparatus, the cathode electrode CAT may be comprised of a transparent conductive layer such as an Indium-tin-oxide (ITO) layer or an indium-zinc-oxide (IZO) layer.

An encapsulation layer 120 suppressing the permeation of moisture may be further disposed on the cathode electrode CAT.

The encapsulation layer 120 may block external moisture or air from permeating the light emitting diode OLED that is vulnerable to external moisture or air. To this end, the encapsulation layer 120 may comprise at least one layer of inorganic encapsulation layers, and at least one layer of organic encapsulation layers, but not be limited. In the present disclosure, the structure of an encapsulation layer 120, in which a first encapsulation layer 121, a second encapsulation layer 122, and a third encapsulation layer 123 are stacked consecutively, is described as an example.

The first encapsulation layer 121 is formed on the substrate 111 where the cathode electrode CAT is formed. The third encapsulation layer 123 may be formed on the substrate 111 where the second encapsulation layer 122 is formed, and together with the first encapsulation layer 121, may be formed to surround the upper surface, the lower surface and the lateral surface of the second encapsulation layer 122. The first encapsulation layer 121 and the third encapsulation layer 123 may minimize or prevent external moisture or air from permeating the light emitting diode OLED. The first encapsulation layer 121 and the third encapsulation layer 123 may be made of an inorganic insulation material such as silicon nitride ($SiN_x$), silicon oxide ($SiO_x$), silicon oxynitride (SiON) or aluminum oxide ($Al_2O_3$) that is deposited in a low-temperature atmosphere. Since the first encapsulation layer 121 and the third encapsulation layer 123 are deposited in the low-temperature atmosphere, the light emitting diode OLED vulnerable to a high-temperature atmosphere may be prevented from being damaged in the process of depositing the first encapsulation layer 121 and the third encapsulation layer 123.

The second encapsulation layer 122 serves as a buffer that decreases stress among layers, caused by a bend of the display apparatus 10, and planarizes a step between layers. The second encapsulation layer 122 may be formed on the substrate 111 where the first encapsulation layer 121 is formed, and may be made of a non-photosensitive organic insulation material such as acrylic resin, epoxy resin, phenolic resin, polyamide resin, polyimide resin, and polyethylene or silicon oxycarbon (SiOC) or a photosensitive organic insulation material such as photoacryl, but not limited. In the case where the second encapsulation layer 122 is formed based on an inkjet method, a dam DAM may be disposed to prevent the second encapsulation layer 122 of a liquid phase from diffusing to the edge of the substrate 111. The dam DAM may be disposed closer to the edge of the substrate 111 than the second encapsulation layer 122. The dam DAM may prevent diffusing of the second encapsulation layer 122 to a pad area disposed at a conductive pad of an outermost edge of the substrate 111.

The dam DAM is designed to prevent the diffusion of the second encapsulation layer 122. However, in the case where the second encapsulation layer 122 is formed over the height of the dam DAM in the process, the second encapsulation layer 122 as an organic layer may be exposed to the outside, making it easier for moisture and the like to permeate into the light emitting diode. To prevent this from happening, at least 10 or more dams DAM may be repeatedly formed.

The dam DAM may be disposed on the second interlayer insulation layer 117 of the non-display area NDA.

Additionally, the dam DAM may be formed at the same time as the first planarization layer 118 and the second planarization layer 119 are formed. When the first planarization layer 118 is formed, the lower layer of the dam DAM is formed, and when the second planarization layer 119 is formed, the upper layer of the dam DAM is formed. Accordingly, the dam DAM may have a double stack structure.

The dam DAM may be made of a material the same as those of the first planarization layer 118 and the second planarization layer 119, but not limited.

The dam DAM may be formed to overlay a low-potential driving power source line VSS. For example, the low-potential driving power source line VSS may be formed in the lower layer of the area, where the dam DAM is disposed, in the non-display area NDA.

The low-potential driving power source line VSS, and the gate driver 300 having a gate in panel (GIP) shape is formed to surround the outer side of the display panel, and the low-potential driving power source line VSS may be disposed further outward than the gate driver 300. Further, the low-potential driving power source line VSS connects to the cathode electrode CAT to supply a common voltage. The gate driver 300 is simply illustrated in the planar and cross-sectional view. However, the gate driver may use a thin film transistor having the same structure as the thin film transistor of the display area DA.

The low-potential driving power source line VSS may be disposed further outward than the gate driver 300. The low-potential driving power source line VSS is disposed further outward than the gate driver 300, and surrounds the display area DA. For example, the low-potential driving power source line VSS may be made of the same material as a first gate electrode GE1 but not limited, and may be made of the same material as the second electrode CST2 or the first source and drain electrode SD1, SD2 but not limited.

Further, the low-potential driving power source line VSS may connect to the cathode electrode CAT electrically. The low-potential driving power source line VSS may provide a low-potential driving voltage EVSS to a plurality of pixels P of the display area DA.

A touch layer may be disposed on the encapsulation layer 120. In the touch layer, a touch buffer layer 151 may be disposed between a touch sensor metal comprising a touch electrode connection line 152, 154 and a touch electrode 155, 156, and the cathode electrode CAT of the light emitting diode EL.

The touch buffer layer 151 may block a liquid chemical (a developing solution or a liquid etchant and the like), which is used in the process of manufacturing the touch sensor metal disposed on the touch buffer layer 151, or moisture from the outside and the like from permeating into the emission layer EL comprising an organic material. Accordingly, the touch buffer layer 151 may prevent damage to the emission layer EL that is vulnerable to a liquid chemical or moisture.

The touch buffer layer 151 is made of an organic insulation material that can be formed at a predetermined temperature (e.g., 100° C. or less) and have permittivity of 1 to 3, to prevent the damage to the emission layer EL comprising an organic material that is vulnerable to a high temperature. For example, the touch buffer layer 151 may be made of an acryl, epoxy or siloxan-based material. The touch buffer layer 151 that is made of an organic insulation material and provides planarization performance may prevent damage to the encapsulation layer 120 and a break of the touch sensor metal formed on the touch buffer layer 151, which are caused by a bend of the organic light emitting display apparatus.

In a mutual capacitance-based touch sensor structure, the touch electrodes 155, 156 may be disposed on the touch buffer layer 151, and the touch electrodes 155, 156 may be disposed to cross each other.

The touch electrode connection line 152, 154 may connect between the touch electrodes 155, 156 electrically. The touch electrode connection line 152, 154 and the touch electrode 155, 156 may be disposed in a different layer, with a touch insulation layer 153 therebetween.

The touch electrode connection line 152, 154 is disposed to overlay the bank layer BNK, to prevent a decrease in an opening ratio.

Additionally, in the touch electrode 155, 156, part of the touch electrode connection line 152 may pass the upper portion and the lateral surface of the encapsulation layer 120, and the upper portion and the lateral surface of the dam DAM, and may connect to a touch driving circuit (not illustrated) electrically through a touch pad PAD.

Part of the touch electrode connection line 152 receives a touch driving signal from the touch driving circuit and delivers the touch driving signal to the touch electrode 155, 156, or may deliver a touch sensing signal at the touch electrode 155, 156 to the touch diving circuit.

A touch protective layer 157 may be disposed on the touch electrode 155, 156. In the drawing, the touch protective layer 157 is only disposed on the touch electrode 155, 156, but not limited. The touch protective layer 157 may also extend to the front or the rear of the dam DAM and be disposed on the touch electrode connection line 152.

Additionally, a color filter (not illustrated) may be further disposed on the encapsulation layer 120, and may be disposed on the touch layer or between the encapsulation layer 120 and the touch layer.

Figure 3:
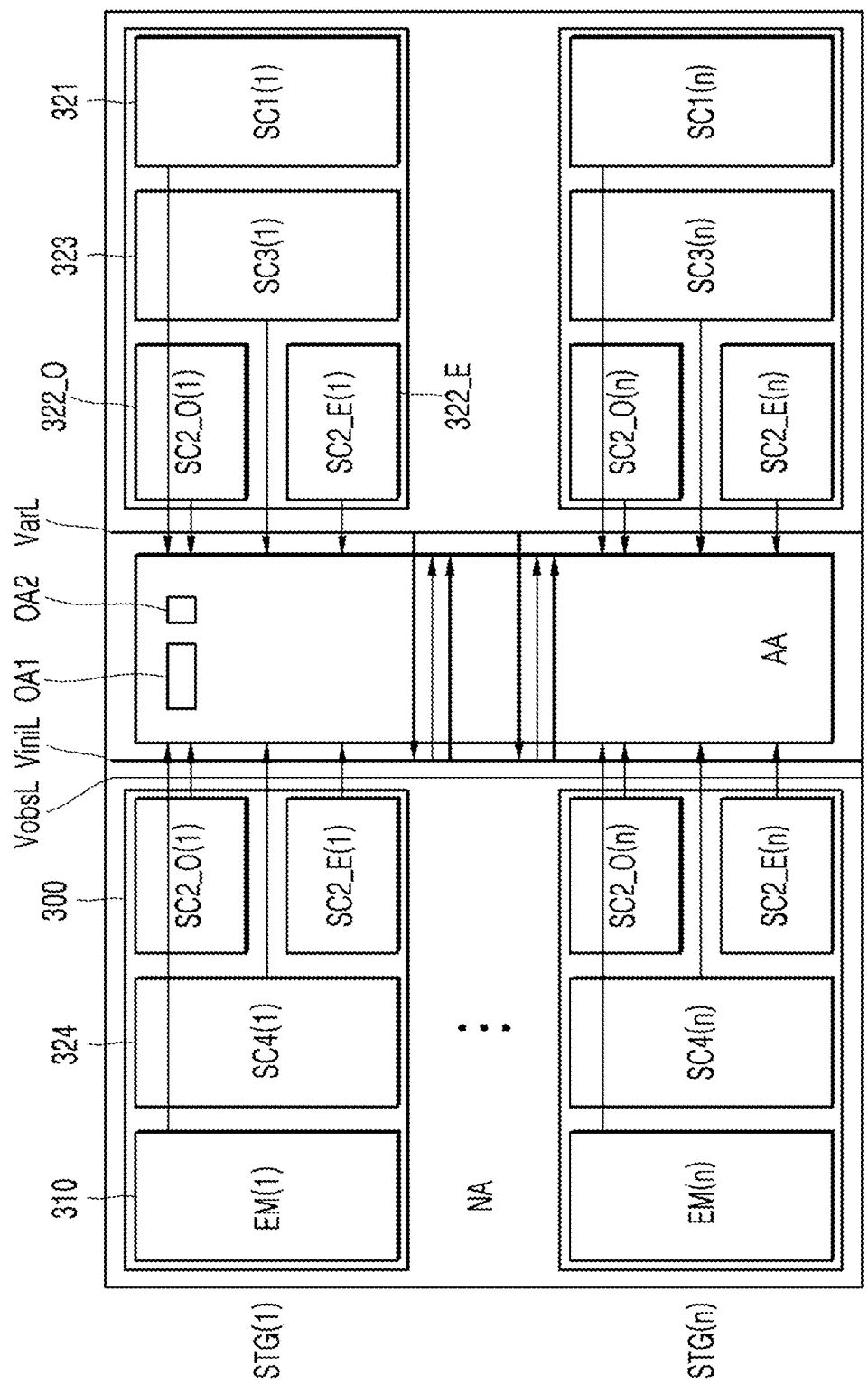
FIG. 3 is a view showing the configuration of a gate driver in a display apparatus, according to an embodiment of the present disclosure.

FIG. 3 is a view showing the configuration of a gate driver in a display apparatus, according to an embodiment of the present disclosure.

Referring to FIG. 3, the gate driver 300 of an embodiment comprises an emission control signal driver 310 and a scan driver. The scan driver may be comprised of a first scan driver to a fourth scan driver 321, 322, 333, 334. Additionally, the second scan driver 322 may be respectively comprised of an odd-numbered second scan driver 322_O and an even-numbered second scan driver 322_E.

In the gate driver 300, a shift register may be configured symmetrically at both sides of the display area AA. Additionally, in the gate driver 300, a shift register at one side of the display area AA may comprise a second scan driver 322_O, 322_E, a fourth scan driver 324 and an emission control signal driver 310. Further, a shift register at the other side of the display area AA may comprise a first scan driver 321, a second scan driver 322_O, 322_E, and a third scan driver 323, but not be limited. The emission control signal driver 310 and the first to fourth scan drivers 321, 322, 323, 324 may be disposed differently depending on embodiments.

Each of the stages STG1 to STGn of the shift register may comprise first scan signal generators SC1(1) to SC1(n), second scan signal generators SC2_O(1) to SC2_O(n), SC2_E(1)~SC2_E(n), third scan signal generators SC3(1) to SC3(n), fourth scan signal generators SC4(1) to SC4(n), and emission control signal generators EM(1) to EM(n).

The first scan signal generators SC1(1) to SC1(n) output first scan signals SC1(1) to SC1(n) through first scan lines SCL1 of the display panel 100. The second scan signal generators SC2(1) to SC2(n) output second scan signals SC2(1) to SC2(n) through second scan lines SCL2 of the display panel 100. The third scan signal generators SC3(1) to SC3(n) output third scan signals SC3(1) to SC3(n) through third scan lines SCL3 of the display panel 100. The fourth scan signal generators SC4(1) to SC4(n) output fourth scan signals SC4(1) to SC4(n) through fourth scan lines SCL4 of the display panel 100. The emission control signal generators EM(1) to EM(n) output emission control signals EM(1)~EM(n) through emission control lines EML of the display panel 100.

The first scan signals SC1(1) to SC1(n) may be used as a signal for driving an A transistor (e.g., a compensation transistor and the like) included in a pixel circuit. The second scan signals SC2(1) to SC2(n) may be used as a signal for driving a B transistor (e.g., a data supply transistor and the like) included in a pixel circuit. The third scan signals SC3(1) to SC3(n) may be used as a signal for driving a C transistor (e.g., a bias transistor and the like) included in a pixel circuit. The fourth scan signals SC4(1) to SC4(n) may be used as a signal for driving a D transistor (e.g., an initialization transistor and the like) included in a pixel circuit. The emission control signals EM(1) to EM(n) may be used as a signal for driving an E transistor (e.g., an emission control transistor and the like) included in a pixel circuit. For example, in the case where the emission control transistor of pixels is controlled with the emission control signals EM(1) to EM(n), the emission time of the light emitting diode EL varies.

Referring to FIG. 3, a bias voltage bus line VobsL, a first initialization voltage bus line VarL, and a second initialization voltage bus line ViniL may be disposed between the gate driver 300 and the display area AA.

The bias voltage bus line VobsL, the first initialization voltage bus line VarL, and the second initialization voltage bus line ViniL may respectively provide a bias voltage Vobs, a first initialization voltage Var and a second initialization voltage Vini to a pixel circuit from the power supplier 500.

In the drawing, each of the bias voltage bus line VobsL, the first initialization voltage bus line VarL and the second initialization voltage bus line ViniL is disposed only at the left side or the right side of the display area AA but not limited. Each of the bias voltage bus line VobsL, the first initialization voltage bus line VarL and the second initialization voltage bus line ViniL may also be disposed at both sides of the display area AA, and the position of each of the bias voltage bus line VobsL, the first initialization voltage bus line VarL and the second initialization voltage bus line ViniL is not limited to any one of the left side and the right side of the display area AA, even in the case where each of the bias voltage bus line VobsL, the first initialization voltage bus line VarL and the second initialization voltage bus line ViniL is disposed at one side of the display area AA.

Referring to FIG. 3, one or more optical areas OA1, OA2 may be disposed in the display area AA.

One or more of the optical areas OA1, OA2 may be disposed to overlay a photographing apparatus such as a camera (an image sensor) and the like, and one or more optoelectronic devices such as a detecting sensor and the like including a proximity sensor and an illuminance sensor and the like.

One or more of the optical areas OA1, OA2 may have a light transmittance structure and have predetermined transmittance or greater, to operate an optoelectronic device. In other words, the number of pixels P per unit area in one or more of the optical areas OA1, OA2 may be less than the number of pixels P per unit area in an ordinary area expect for the optical areas OA1, OA2 in the display area AA. That is, the resolution of one or more of the optical areas OA1, OA2 may be less than that of an ordinary area in the display area AA.

The light transmittance structure in one or more of the optical areas OA1, OA2 may be formed in a way that a cathode electrode is patterned in a portion where a pixel P is not disposed. At this time, the patterned cathode electrode may be removed with a laser, or a cathode electrode may be selectively formed and patterned by using a material such as a cathode deposition prevention layer.

Additionally, the light transmittance structure in one or more of the optical areas OA1, OA2 may also be formed in a way that the light emitting diode EL and the pixel circuit are separately formed in the pixel P. In other words, the light emitting diode EL of the pixel P is disposed on the optical areas OA1, OA2, and a plurality of transistors TFT constituting the pixel circuit is disposed around the optical areas OA1, OA2, such that the light emitting diode EL and the pixel circuit are electrically connected through a transparent metallic layer.

Figure 4:
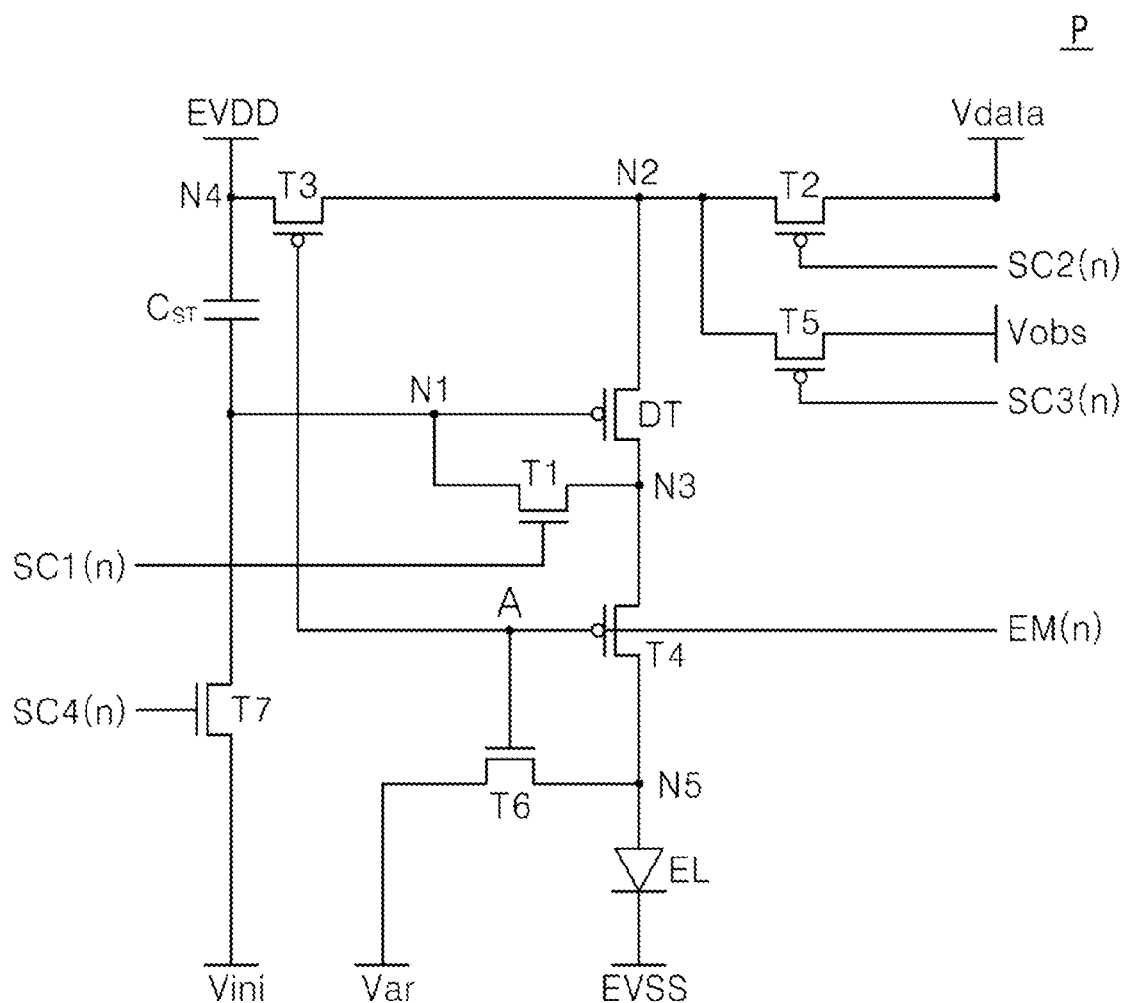
FIG. 4 is a view showing a pixel circuit in a display apparatus, according to an embodiment of the present disclosure.

FIG. 4 is a view showing a pixel circuit in a display apparatus, according to an embodiment of the present disclosure.

FIG. 4 shows a pixel circuit exemplarily for description. The structure of the pixel circuit is not limited as long as an emission signal EM(n) is supplied to control the emission of the light emitting diode EL. For example, the pixel circuit may comprise an additional scan signal, a switching thin film transistor connects to the additional scan signal, and a switching thin film transistor to which an additional initialization voltage is supplied, and the connection relationship of a switching element or the connection position of a capacitor may vary. Hereafter, a display apparatus having the pixel circuit structure of FIG. 4 is described for convenience of description.

Referring to FIG. 4, each of the plurality of pixels P in an embodiment may comprise a pixel circuit having a driving transistor DT, and a light emitting diode EL connecting to the pixel circuit.

The pixel circuit may control driving current flowing in the light emitting diode EL to drive the light emitting diode EL. The pixel circuit may comprise a driving transistor DT, first to seventh transistors T1 to T7, and a capacitor Cst. Each of the transistors DT, T1 to T7 may comprise a first electrode, a second electrode and gate electrode. One of the first electrode and the second electrode may be a source electrode, and the other may be a drain electrode.

Each of the transistors DT, T1 to T7 may be a P-type thin film transistor or an N-type thin film transistor. In the embodiment of FIG. 4, the first transistor T1, the sixth transistor T6 and the seventh transistor T7 are an N-type thin film transistor, and the remaining transistors DT, T2 to T5 are a P-type thin film transistor, but not limited. Depending on embodiment, all or part of the transistors DT, T1 to T7 may be a P-type thin film transistor or an N-type thin film transistor. Additionally, the N-type thin film transistor may be an oxide thin film transistor, and the P-type thin film transistor may be a low-temperature polycrystalline silicon (LTPS) thin film transistor.

Hereafter, the first transistor T1, the sixth transistor T6 and the seventh transistor T7 may be an N-type thin film transistor, and the remaining transistors DT, T2 to T5 may be a P-type thin film transistor, for example. Accordingly, the first transistor T1, the sixth transistor T6 and the seventh transistor T7 are turned on by applying a high voltage, and the other transistors DT, T2 to T5 are turned on by applying a low voltage.

In an example, the first transistor T1, the second transistor T2, the third and fourth transistors T3, T4, the fifth transistor T5, and the sixth and seventh transistors T6, T7, constituting a pixel circuit, may respectively serve as a compensation transistor, a data supply transistor, an emission control transistor, a bias transistor, and an initialization transistor. The sixth transistor T6 may operate as a reset transistor for resetting the anode electrode of the light emitting diode EL, among initialization transistors.

The light emitting diode EL may comprise a first electrode and a second electrode. The first electrode of the light emitting diode EL may be an anode electrode, and the second electrode of the light emitting diode EL may be a cathode electrode. The anode electrode of the light emitting diode EL may connect to the fifth node N5, and the cathode electrode may connect to the low-potential driving voltage EVSS.

The driving transistor DT may comprise a first electrode connecting to a second node N2, a second electrode connecting to a third node N3, and a gate electrode connecting to the first node N1. The driving transistor DT may provide driving current Id to the light emitting diode EL, based on a voltage of the first node N1 (or a data voltage stored in a capacitor Cst described hereafter).

The first transistor T1 may comprise a first electrode connecting to the first node N1, a second electrode connecting to the third node N3, and a first gate electrode receiving a first scan signal SC1(n). The first transistor T1 may be turned on in response to the first scan signal SC1(n), diode-connected between the first node N1 and the third node N3, and sample a threshold voltage Vth of the driving transistor DT. The first transistor T1 may be a compensation transistor.

The capacitor Cst may be connected or formed between the first node N1 and the fourth node N4. The capacitor Cst may store or maintain a provided high-potential driving voltage EVDD.

The second transistor T2 may comprise a first electrode connecting to the data line DL (or receiving a data voltage Vdata), a second electrode connecting to the second node N2, and a second gate electrode receiving a second scan signal SC2(n). The second transistor T2 may be turned on in response to the second scan signal SC2(n), and deliver a data voltage Vdata to the second node N2. The second transistor T2 may be a data supply transistor.

The third transistor T3 and the fourth transistor T4 (or first and second emission control transistors) may connect between a high-potential driving voltage EVDD and the light emitting diode EL, and form a current movement path in which driving current Id generated by the driving transistor DT moves.

The third transistor T3 may comprise a first electrode connecting to the fourth node N4 and receiving a high-potential driving voltage EVDD, a second electrode connecting to the second node N2, and a third gate electrode receiving an emission control signal EM(n).

The fourth transistor T4 may comprise a first electrode connecting to the third node N3, a second electrode connecting to a fifth node N5 (or the anode electrode of the light emitting diode EL), and a fourth gate electrode receiving an emission control signal EM(n). The fourth gate electrode may connect to node A of the emission control signal line.

The third and fourth transistors T3, T4 may be turned on in response to an emission control signal EM(n), and at this time, driving current Id may be provided to the light emitting diode EL, and the light emitting diode EL may emit light having luminance that corresponds to the driving current Id.

The fifth transistor T5 may comprise a first electrode receiving a bias voltage Vobs, a second electrode connecting to the second node N2, and a fifth electrode receiving a third scan signal SC3(n). The fifth transistor T5 may be a bias transistor.

The sixth transistor T6 may comprise a first electrode receiving a first initialization voltage Var, a second electrode connecting to the fifth node N5, and a sixth gate electrode receiving an emission control signal EM(n). The first electrode of the sixth transistor T6 may connect to the reset voltage line, and the sixth gate electrode of the sixth transistor T6 may connect to node A.

The sixth transistor T6 may be turned on in response to a high-level emission control signal EM before the light emitting diode EL emits light (or after the light emitting diode EL emits light), and initialize the anode electrode (or the pixel electrode) of the light emitting diode EL by using the first initialization voltage Var. The light emitting diode EL may have a parasitic capacitor that is formed between the anode electrode and the cathode electrode of the light emitting diode EL. The parasitic capacitor may be charged while the light emitting diode EL emits light, and the anode electrode of the light emitting diode EL may have a certain voltage. Accordingly, the first initialization voltage Var may be supplied to the anode electrode of the light emitting diode EL through the sixth transistor T6, to initialize the amount of charge accumulated in the light emitting diode EL.

In the present disclosure, the third, fourth and sixth gate electrodes of the third, fourth and sixth transistors T3, T4, T6 are configured to receive an emission control signal EM(n) commonly. In an emission period, a low-level emission control signal EM(n) is supplied to the third, fourth and sixth gate electrodes, to turn on the third and fourth transistors T3, T4, and in a initialization period, a high-level emission control signal EM(n) is supplied to the third, fourth and sixth gate electrodes, to turn on the sixth transistor T6 only.

The seventh transistor T7 may comprise a first electrode receiving a second initialization voltage Vini, a second electrode connecting to the first node N1, and a gate electrode receiving a fourth scan signal SC4(n).

The seventh transistor T7 may be turned on in response to the fourth scan signal SC4(n), and initialize the gate electrode of the driving transistor DT by using the second initialization voltage Vini. Because of a high-potential driving voltage EVDD stored in the capacitor Cst, unnecessary electric charges may remain in the gate electrode of the driving transistor DT. Accordingly, the second initialization voltage Vini may be supplied to the gate electrode of the driving transistor DT through the seventh transistor T7, to initialize the amount of remaining charges.

Figure 5:
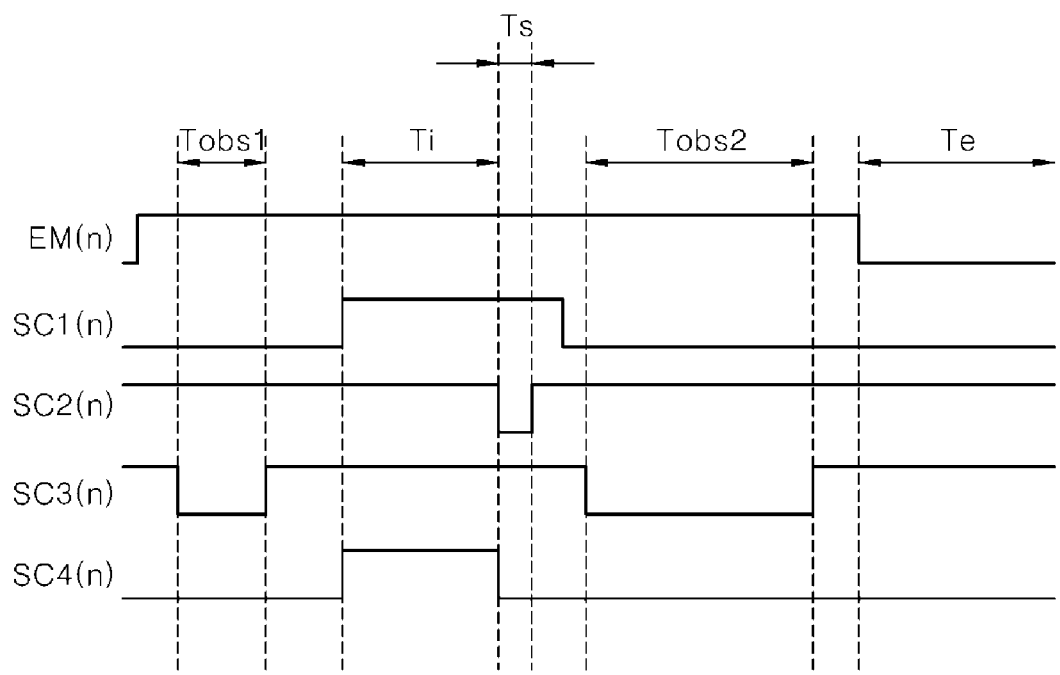
FIG. 5 is a view for describing the operations of the pixel circuit illustrated in FIG. 4 by a scan signal and an emission control signal in a refresh period, according to an embodiment of the present disclosure.
Figure 6:
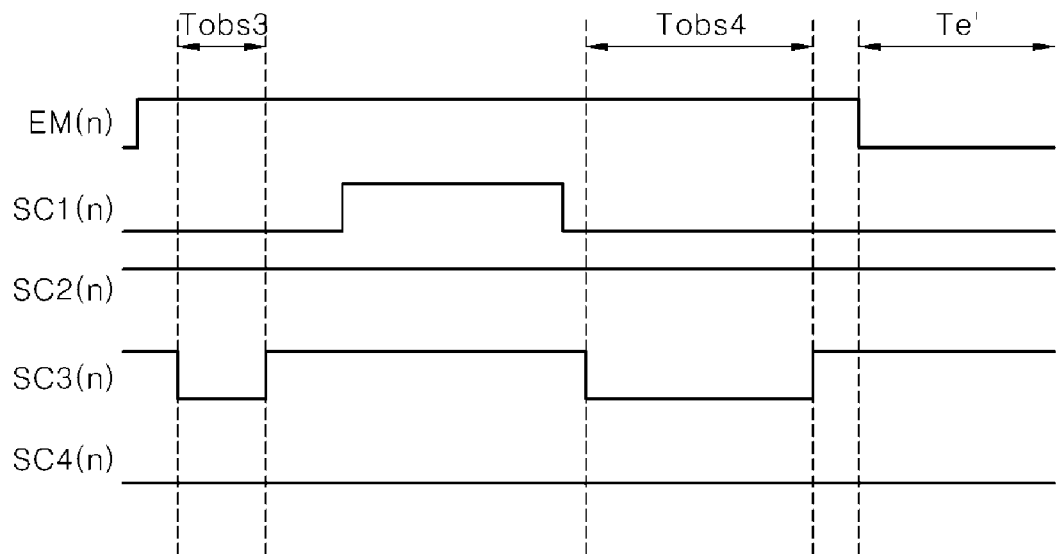
FIG. 6 is a view for describing the operations of the pixel circuit illustrated in FIG. 4 by a scan signal and an emission control signal in a hold period, according to an embodiment of the present disclosure.

FIGS. 5 and 6 are views for describing the operations of a scan signal and an emission control signal in a refresh period and a hold period at the pixel circuit illustrated in FIG. 4. That is, FIG. 5 is a view for describing the operations of a scan signal and an emission control signal in a refresh period of the pixel circuit illustrated in FIG. 4, according to an embodiment of the present disclosure. FIG. 6 is a view for describing the operations of a scan signal and an emission control signal in a hold period of the pixel circuit illustrated in FIG. 4, according to an embodiment of the present disclosure.

The display apparatus of an embodiment may operate as a variable refresh rate (VRR) mode display apparatus. The VRR mode may denote driving the display apparatus at a predetermined frequency, and then increasing the refresh rate, at which the data voltage is updated, and operating a pixel at a time when high-speed driving is required, or decreasing the refresh rate and operating a pixel at a time when power consumption needs to decrease or low-speed driving is required.

Each of the plurality of pixels P may be driven within one second, based on a combination of a refresh frame and a hold frame. In the present disclosure, one set is defined as the repetition of a combination of a refresh period during which the data voltage Vdata is updated and a hold period during which the data voltage Vdata is not updated, for one second. Additionally, one set period is a period during which a combination of the refresh period and the hold period is repeated.

In the case where the refresh rate is at 120 Hz, the display apparatus may operate only based on refresh periods. For example, the refresh period may be repeated 120 times within one second. One refresh period is $1/120=8.33$ ms, and one set period is also 8.33 ms.

In the case where the refresh rate is at 60 Hz, the display apparatus may operate based on an alternation of the refresh period and the hold period. For example, each of the refresh period and the hold period may be repeated alternately 60 times within one second. One refresh period and one hold period may be respectively $0.5/60=8.33$ ms, and one set period is 16.66 ms.

In the case where the refresh rate is at 1 Hz, one frame may be driven in one refresh period and in 119 hold periods after one refresh period. Additionally, in the case where the refresh rate is at 1 Hz, one frame may be driven in a plurality of refresh periods and a plurality of hold periods. At this time, one refresh period and one hold period are respectively $1/120=8.33$ ms, and one set is 1 s.

In the refresh period, a new data voltage Vdata is charged and supplied to the driving transistor DT, and in the hold period, the data voltage Vdata of a previous frame is maintained and used. Further, the hold period is also referred to as a skip period since the process of supplying a new data voltage Vdata to the driving transistor DT is omitted.

Each of the plurality of pixels P may initialize a voltage that is charged into the pixel circuit or remains in the pixel circuit, in the refresh period. Specifically, each of the plurality of pixels P may remove the effect of the data voltage Vdata and high-potential driving voltage EVDD that are stored in the previous frame in the refresh period. Thus, each of the plurality of pixels P may display an image corresponding to a new data voltage Vdata in the hold period.

Each of the plurality of pixels P provides driving current corresponding to a data voltage Vdata to the light emitting diode EL, to display an image, and keep the light emitting diode EL turned on, during the hold period.

The operations of the pixel circuit and the light emitting diode in the refresh period of FIG. 5 are described. The refresh period may comprise at least one bias period Tobs1, Tobs2, at least one initialization period Ti, at least one sampling period Ts, and at least one emission period Te, but not be limited in the above-described order.

Referring to FIG. 5, the pixel circuit may operate for a refresh period comprising at least one bias period Tobs1, Tobs2.

At least one bias period Tobs1, Tobs2 is a period during which an on bias stress operation OBS, where a bias voltage Vobs is supplied, is performed, and the emission control signal EM(n) is a high voltage. Accordingly, the third and fourth transistors T3, T4 are turned off, while the sixth transistor T6 is turned on. As the sixth transistor T6 is turned on, a reset voltage Var is supplied to the fifth node N5 via the sixth transistor T6. Accordingly, the anode electrode, which is the first electrode of the light emitting diode EL connecting to the fifth node N5, is initialized and reset.

The first scan signal SC1 (n) and the fourth scan signal SC4(n) are low voltages, and the first T1 and seventh T7 transistors are turned off. The second scan signal SC2 is a high voltage, and the second transistor T2 is turned off.

The third scan signal SC3(n) is input as a low voltage, and the fifth transistor T5 is turned on. As the fifth transistor T5 is turned on, a bias voltage Vobs is supplied to the first electrode of the driving transistor DT connecting to the second node N2.

The bias voltage Vobs is supplied to the third node N3 that is a drain electrode of the diving transistor DT, reducing a charging period or a delay in charging of the voltage of the fifth node N5 that is an anode electrode of the light emitting diode EL during the emission period. The driving transistor DT is maintained in a stronger saturation state.

For example, as the bias voltage Vobs increases, the voltage of the third node N3 that is a drain electrode of the driving transistor DT may increase, and the gate source voltage or drain source voltage of the driving transistor DT may decrease. Preferably, the bias voltage Vobs is greater than the data voltage Vdata.

At this time, the magnitude of drain source current Id passing through the driving transistor DT may decrease, and the stress of the driving transistor DT may decrease in a positive bias stress state, to solve the problem of a delay in charging the voltage of the third node N3. In other words, performing the on bias stress operation OBS before the sampling of the threshold voltage Vth of the driving transistor DT may result in a reduction in the hysteresis of the driving transistor DT.

The on bias stress operation OBS in at least one bias period Tobs1, Tobs2 may be defined as supplying a proper bias voltage to the driving transistor DT directly during non-emission periods.

Additionally, in at least one bias period Tobs1, Tobs2, as the sixth transistor T6 is turned on, the anode electrode (or pixel electrode) of the light emitting diode EL connecting to the fifth node N5 is initialized to the first initialization voltage Var.

Referring to FIG. 5, the pixel circuit may operate for a refresh period comprising an initialization period Ti. The initialization period Ti is a period during which the voltage of the gate electrode of the driving transistor DT is initialized.

The first SC1(n) to fourth SC4(n) scan signals and the emission control signal EM(n) are high voltages, and the first T1, sixth T6 and seventh transistors T7 are turned on, while the second to fifth transistors T2, T3, T4, T5 are turned off. As the first and seventh transistors T1, T7 are turned on, the gate electrode and the second electrode of the driving transistor DT connecting to the first node N1 are initialized to the second initialization voltage Vini. Further, as the sixth transistor T6 is turned on, the anode electrode (or pixel electrode) of the light emitting diode EL connecting to the fifth node N5 is initialized to the first initialization voltage Var.

Referring to FIG. 5, the pixel circuit may operate for a refresh period comprising a sampling period Ts. The sampling period is a period during which the threshold voltage Vth of the driving transistor DT is sampled.

The first scan signal SC1(n), the third scan signal SC3(n) and the emission control signal EM(n) are input as high voltages, and the second scan signal SC2(n) and the fourth scan signal SC4(n) are input as low voltages. Accordingly, the third to fifth and seventh transistors T3, T4, T5, T7 are turned off, the first transistor T1 stays turned on, and the second T2 and sixth T6 transistors are turned on. That is, as the second transistor T2 is turned on, a data voltage Vatat is supplied to the driving transistor DT, and the first transistor T1 diode-connects between the first node N1 and the third node N3, such that the threshold voltage Vth of the driving transistor DT is sampled. At this time, as the sixth transistor T6 is turned on, the anode electrode (or pixel electrode) of the light emitting diode EL connecting to the fifth node N5 is initialized to the first initialization voltage Var.

Referring to FIG. 5, the pixel circuit may operate in a refresh period comprising an emission period Te. The emission period Te is a period for which a sampled threshold voltage Vth is offset, and the light emitting diode EL emits light at driving current corresponding to a sampled data voltage.

An emission control signal EM(n) is a low voltage, the third and fourth transistors T3, T4 are turned on, and the sixth transistor T6 is turned off.

As the third transistor T3 is turned on, a high-potential driving voltage EVDD connecting to the fourth node N4 is supplied to the first electrode of the driving transistor DT connecting to the second node N2 through the third transistor T3. In the driving transistor DT, driving current Id supplied to the light emitting diode EL via the fourth transistor T4 does not relate to a value of the threshold voltage Vth of the driving transistor DT, and the threshold voltage Vth of the driving transistor DT is compensated.

The operations of the pixel circuit and light emitting diode in the hold period are described with reference to FIG. 6.

The hold period may comprise at least one bias period Tobs3, Tobs4 and at least one emission period Te'. The operation of the pixel circuit in the refresh period is the same as that in the hold period. Thus, description in relation to the operation of the pixel circuit in the hold period is omitted.

While a new data voltage Vdata is charged and is supplied to the gate electrode of the driving transistor DT, in the refresh period, as described above, the data voltage Vdata in the refreshed period is maintained and used in the hold period. Accordingly, in the hole period, the initialization period T1 and the sampling period Ts are not required while they are required in the refresh period.

In the operation of the hold period, one on bias stress operation OBS is enough. However, in the embodiment, the third scan signal SC3(n) in the hold period, and the third scan signal SC3(n) in the refresh period are driven in the same way, for convenience of a driving circuit. Accordingly, the on bias stress operation OBS may be performed twice in the hold period, like the on bias stress operation OBS is performed twice in the refresh period.

The operation in the refresh period, described with reference to FIG. 5, and the operation in the hold period, described with reference to FIG. 6, differ based on the second and fourth scan signals SC2(n), SC4(n). Since the initialization period T1 and the sampling period Ts are not required in the hold period, the second scan signal SC2(n) is a high voltage all the time, and the fourth scan signal SC4(n) is a low voltage all the time. That is, the second and seventh transistors T2, T7 are turned off all the time.

In the case where the emission control signal EM(n) is a high voltage even in the hold period, the third and fourth transistors T3, T4 that are emission transistors are turned off, and the sixth transistor T6 that is a reset transistor is turned on.

As the sixth transistor T6 is turned on, the anode electrode (or pixel electrode) of the light emitting diode EL connecting to the fifth node N5 is initialized to the first initialization voltage Var.

Figure 7:
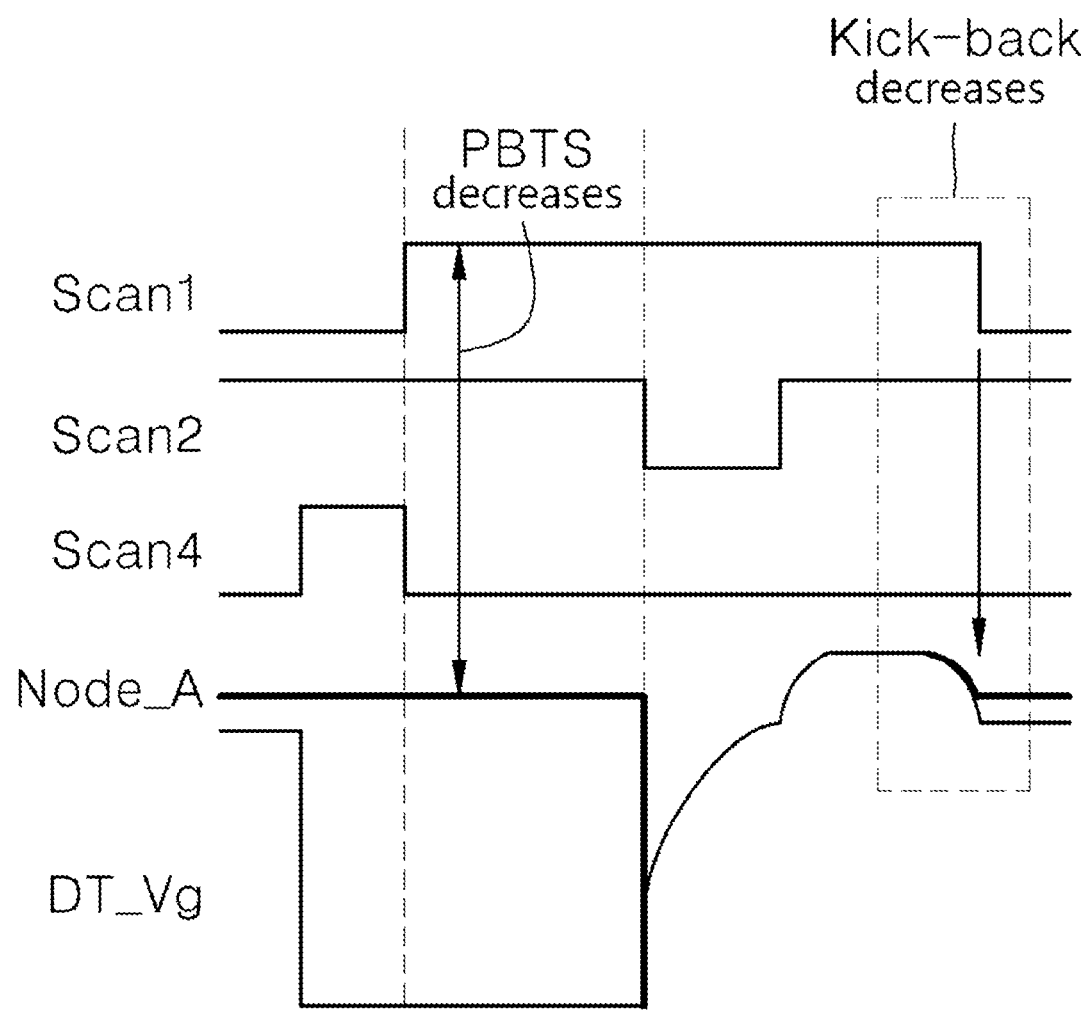
FIG. 7 is a view showing an example of an effect of using a reset transistor of a display apparatus, according to an embodiment of the present disclosure as an oxide TFT.

FIG. 7 is a view showing an example of an effect that is produced in the case where an oxide TFT is used for a reset transistor of a display apparatus, according to an embodiment of the present disclosure.

As described above, the fourth gate electrode of the emission transistor T4 and the sixth gate electrode of the reset transistor T6 are connected and shared by the emission control signal line (node A), such that the anode electrode of the light emitting diode may be initialized and reset at any time the light emitting diode EL does not emit light.

At this time, since the first electrode of the emission transistor T4 and the second electrode of the driving transistor DT connect, the driving transistor DT is affected by the voltage of node A.

As a result, the positive bias temperature stress (PBTS) of node A, to which the two gate electrodes of the emission transistor T4 and the reset transistor T6 connect, decreases as illustrated in FIG. 7, and the kick back of a voltage Vgs between the gate sources of the driving transistor DT decreases, resulting in a decrease in the sensitivity of the driving transistor DT.

Figure 8:
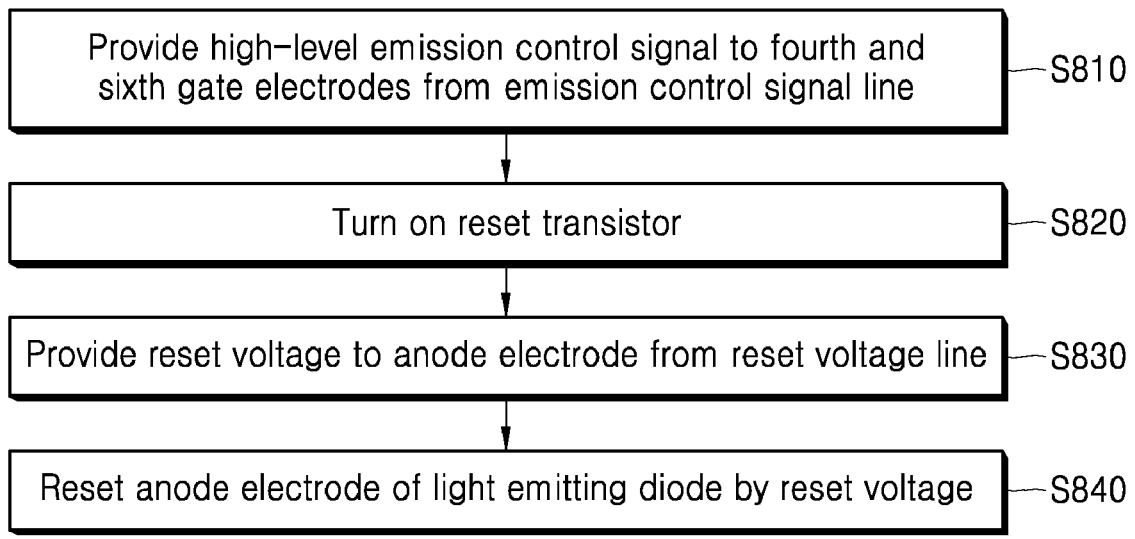
FIG. 8 is a flowchart showing a driving method of a display apparatus, according to an embodiment of the present disclosure.

FIG. 8 is a flowchart showing a diving method of a display apparatus, according to an embodiment of the present disclosure.

Referring to FIG. 8, the driving method of a display apparatus of an embodiment comprises supplying a high-level emission control signal to the fourth gate electrode of the emission transistor T4 and the sixth gate electrode of the reset transistor T6 from the emission signal line (S810).

At this time, the emission transistor T4 is a P-type thin film transistor that is turned off by a high-level emission control signal, and the reset transistor T6 is an N-type thin film transistor that is turned on by a high-level emission control signal.

Then the reset transistor T6 may be turned on by a high-level emission signal (S820).

At this time, the emission transistor T4 may be turned off by a high-level emission signal.

Then a reset voltage Var may be supplied to the anode electrode N5 of the light emitting diode EL from the reset voltage line, via the reset transistor T6 (S830).

Then the anode electrode of the light emitting diode EL is initialize and reset by the reset voltage Var (S840).

Then a low-level emission control signal may be provided to the fourth gate electrode of the emission transistor T4 and the sixth gate electrode of the reset transistor T6 from the emission signal line, for the emission period. The emission transistor T4 is turned on by a low-level emission control signal, and a data voltage is provided to the light emitting diode EL via the emission transistor T4 from the data voltage line. At this time, the reset transistor T6 is turned off by a low-level emission control signal. Accordingly, the light emitting diode EL emits light, based on the provided data voltage.

In the embodiment, embodied is a display apparatus in which the first (anode) electrode of the light emitting diode EL, one electrode (a source or drain electrode) of the emission transistor T4, and one electrode (a source or drain electrode) of the reset transistor T6 connect to one another, and the fourth gate electrode of the emission transistor T4 and the sixth gate electrode of the reset transistor T6 connect to the emission control signal line EML.

In the embodiment, embodied is a driving method of a display apparatus, comprising (a) providing a high-level emission control signal EM to the fourth gate electrode of the emission transistor T4 and the sixth gate electrode of the reset transistor T6 from the emission control signal line EM, (b) turning on the reset transistor T6, based on the high-level emission control signal EM, and turning off the emission transistor T4, (c) providing a reset voltage VAR to the anode electrode of the light emitting diode EL from the reset voltage line via the reset transistor T6, and (d) resetting the anode electrode, based on the reset voltage VAR.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiment.

DESCRIPTION OF REFERENCE NUMERALS

| | |
|---|---|
| 10: Display apparatus | 100: Display panel |
| 200: Controller | 300: Gate driver |
| 310: Emission driver | 320: Scan driver |
| 400: Data driver | 500: Power supplier |
| T1~T7: Transistor | DT: Driving transistor |
| P: Pixel | Cst: Capacitor |
| AA: Display area | NA: Non-display area |

What is claimed is:

1. A display apparatus, comprising:
a light emitting element comprising a first electrode and a second electrode;
an emission transistor comprising a first electrode of the emission transistor, a second electrode of the emission transistor that is connected to the first electrode of the light emitting element, and a fourth gate electrode; and
a reset transistor comprising a first electrode of the reset transistor that is connected to the first electrode of the light emitting element, a second electrode of the reset transistor that is connected to a reset voltage line, and a sixth gate electrode that is connected to the fourth gate electrode,
wherein the second electrode of the light emitting element is connected to a second power source line, and the fourth gate electrode and the sixth gate electrode are respectively connected to an emission control signal line.

2. The display apparatus of claim 1, wherein the first electrode of the light emitting element comprises an anode electrode.

3. The display apparatus of claim 1, wherein the second electrode of the light emitting element comprises a cathode electrode.

4. The display apparatus of claim 1, wherein in the emission transistor, the first electrode of the emission transistor is a source electrode and the second electrode of the emission transistor is a drain electrode, or the first electrode of the emission transistor is a drain electrode and the second electrode of the emission transistor is a source electrode.

5. The display apparatus of claim 1, wherein in the reset transistor, the first electrode of the reset transistor is a source electrode and the second electrode of the reset transistor is a drain electrode, or the first electrode of the reset transistor is a drain electrode and the second electrode of the reset transistor is a source electrode.

6. The display apparatus of claim 1, wherein the light emitting element comprises an organic electric field light emitting diode.

7. The display apparatus of claim 1, wherein the emission transistor is a P-type thin film transistor.

8. The display apparatus of claim 1, wherein the reset transistor is an N-type thin film transistor.

9. The display apparatus of claim 1, wherein the emission transistor is a low-temperature polycrystalline silicon (LTPS) thin film transistor.

10. The display apparatus of claim 1, wherein the reset transistor is an oxide thin film transistor.

11. A display apparatus, comprising:
a display panel comprising a plurality of pixels;
an emission driver configured to provide an emission control signal to each of the plurality of pixels;
a scan driver configured to provide a scan signal to each of the plurality of pixels;
a data driver configured to provide a data voltage to each of the plurality of pixels; and
a controller configured to control the scan driver, the data driver, and the emission driver,
wherein each of the plurality of pixels comprises:
 a light emitting element comprising a first electrode connected to a fifth node, and a second electrode connected to a low-potential driving voltage;
 a fourth transistor comprising a first electrode of the fourth transistor that is connected to a third node, a second electrode of the fourth transistor that is connected to the fifth node, and a fourth gate electrode that is connected to node A of an emission control signal line; and
 a sixth transistor comprising a first electrode of the sixth transistor that is connected to a reset voltage line, a second electrode of the sixth transistor that is connected to the fifth node, and a sixth gate electrode that is connected to the node A.

12. The display apparatus of claim 11, further comprising:
a driving transistor comprising a first electrode of the driving transistor that is connected to a second node, a second electrode of the driving transistor that is connected to the third node, and a gate electrode connected to a first node;
a first transistor comprising a first electrode of the first transistor that is connected to the first node, a second electrode of the first transistor that is connected to the third node, and a first gate electrode that receives a first scan signal;
a second transistor comprising a first electrode of the second transistor that receives the data voltage, a second electrode of the second transistor that is connected to the second node, and a second gate electrode that receives a second scan signal;
a third transistor comprising a first electrode of the third transistor that is connected to a fourth node and receives a high-potential diving voltage, a second electrode of the third transistor that is connected to the second node, and a third gate electrode that receives the emission control signal;
a fifth transistor comprising a first electrode of the fifth transistor that receives a bias voltage, a second electrode of the fifth transistor that is connected to the second node, and a fifth gate electrode that receives a third scan signal;
a seventh transistor comprising a first electrode of the seventh transistor that receives a second initialization voltage, a second electrode of the seventh transistor that is connected to the first node, and a gate electrode of the seventh transistor that receives a fourth scan signal; and
a storage capacitor connecting the first node and the fourth node.

13. A display apparatus, comprising:
a substrate comprising a display area and a non-display area;
a buffer layer on the substrate;
a first insulation layer on the buffer layer;
a fourth semiconductor layer of an emission transistor and a sixth semiconductor layer of a reset transistor on the first insulation layer;
a second insulation layer on the first insulation layer, the fourth semiconductor layer, and the sixth semiconductor layer;
a low-potential driving power source line, a fourth gate electrode of the emission transistor, and a sixth gate electrode of the reset transistor on the second insulation layer;
a third insulation layer on the second insulation layer, the low-potential driving power source line, the fourth gate electrode, and the sixth gate electrode;
a first electrode and a second electrode of the emission transistor on the third insulation layer and contacting the fourth semiconductor layer through a first contact hole, and a first electrode and a second electrode of the reset transistor on the third insulation layer and contacting the sixth semiconductor layer through a second contact hole;
a protective layer on the third insulation layer, the first electrode and the second electrode of the emission transistor, and the first electrode and the second electrode of the reset transistor;
a first intermediate layer on the protective layer in the display area;
a connection electrode on the first intermediate layer in the display area, and contacting the first electrode or the second electrode of the emission transistor through a third contact hole and contacting the first electrode or the second electrode of the reset transistor;
a second intermediate layer on the first intermediate layer and the connection electrode in the display area;
a first electrode of a light emitting element on the second intermediate layer in the display area, and contacting the connection electrode through a fourth contact hole;
a bank layer on the second intermediate layer, except for the first electrode of the light emitting element in the display area;
an emission layer on the bank layer and the first electrode of the light emitting element in the display area;
a second electrode of the light emitting element on the emission layer in the display area; and
an encapsulation layer on the second electrode of the light emitting element in the display area, and on the protective layer in the non-display area.

14. The display apparatus of claim 13, wherein the fourth gate electrode and the sixth gate electrode both contact an emission signal line.

15. The display apparatus of claim 13, wherein the first electrode or the second electrode of the emission transistor contacts with a driving transistor without being connected to the connection electrode.

16. The display apparatus of claim 13, wherein the first electrode or the second electrode of the reset transistor contacts with a reset voltage line without being connected to the connection electrode.

17. A driving method of a display apparatus which comprises a light emitting element comprising an anode electrode and a cathode electrode; an emission transistor comprising a second electrode connected to the anode electrode, and a first electrode and a fourth gate electrode connected to a data voltage line; and a reset transistor comprising a first electrode connected to the anode electrode, a sixth gate electrode connected to the fourth gate electrode, and a second electrode connected to a reset voltage line, wherein the cathode electrode connects to a second power source line, and the fourth gate electrode and the sixth gate electrode respectively connect to an emission control signal line, the driving method comprising:
  providing a high-level emission control signal to the fourth gate electrode of the emission transistor and the sixth gate electrode of the reset transistor from the emission control signal line;
  turning on the reset transistor based on the high-level emission control signal;
  providing a reset voltage to the anode electrode of the light emitting element from the reset voltage line through the reset transistor; and
  resetting the anode electrode based on the reset voltage.

18. The driving method of claim 17, wherein turning on the reset transistor based on the high-level emission control signal further comprises turning off the emission transistor by the high-level emission control signal.

19. The driving method of claim 17, further comprising:
  providing a low-level emission control signal to the fourth gate electrode and the sixth gate electrode from the emission control signal line;
  turning on the emission transistor based on the low-level emission control signal;
  providing a data voltage to the light emitting element from the data voltage line through the emission transistor; and
  emitting light from the light emitting element by the data voltage.

20. The driving method of claim 19, wherein turning on the emission transistor based on the low-level emission control signal further comprises turning off the reset transistor using the low-level emission control signal.

* * * * *